United States Patent
Seo et al.

(10) Patent No.: US 11,380,722 B2
(45) Date of Patent: Jul. 5, 2022

(54) IMAGE SENSOR DEVICE

(71) Applicant: Samsung Electronics Co., Ltd., Suwon-si (KR)

(72) Inventors: Min-Woong Seo, Hwasung-si (KR); JungChak Ahn, Yongin-si (KR); Jae-kyu Lee, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 250 days.

(21) Appl. No.: 16/591,059

(22) Filed: Oct. 2, 2019

(65) Prior Publication Data

US 2020/0258926 A1 Aug. 13, 2020

(30) Foreign Application Priority Data

Feb. 8, 2019 (KR) .................. 10-2019-0014876

(51) Int. Cl.
| | |
|---|---|
| *H01L 27/146* | (2006.01) |
| *H04N 5/335* | (2011.01) |
| *H01L 27/108* | (2006.01) |
| *H04N 5/355* | (2011.01) |
| *H04N 5/357* | (2011.01) |

(52) U.S. Cl.
CPC ...... *H01L 27/14616* (2013.01); *H01L 27/108* (2013.01); *H01L 27/14603* (2013.01); *H01L 27/14643* (2013.01); *H04N 5/3355* (2013.01); *H04N 5/3559* (2013.01); *H04N 5/357* (2013.01)

(58) Field of Classification Search
CPC ......... H01L 27/14643; H01L 27/14603; H01L 27/14636; H01L 27/14634; H01L 27/108; H04N 5/3355; H04N 5/3559; H04N 5/357
See application file for complete search history.

(56) References Cited

U.S. PATENT DOCUMENTS

| | | |
|---|---|---|
| 6,927,796 B2 | 8/2005 | Liu et al. |
| 6,975,355 B1 | 12/2005 | Yang et al. |
| 8,773,562 B1 | 7/2014 | Fan |
| 8,946,610 B2 | 2/2015 | Iwabuchi et al. |
| 9,064,769 B2 | 6/2015 | Kozlowski |
| 9,077,922 B2 | 7/2015 | Wakano et al. |
| 9,231,011 B2 | 1/2016 | Solhusvik et al. |
| 9,299,732 B2 | 3/2016 | Webster et al. |

(Continued)

OTHER PUBLICATIONS

David Schor, "IEDM 2017: Sony's 3-layer stacked CMOS image sensor technology", https://fuse.wikichip.org/news/763/iedm-2017-sonys-3-layer-stacked-cmos-image-sensortechnology, Feb. 3, 2018.

*Primary Examiner* — Vongsavanh Sengdara
(74) *Attorney, Agent, or Firm* — Harness, Dickey & Pierce, P.L.C.

(57) ABSTRACT

An image sensor device includes a digital pixel that includes a photo detector, a comparator, and a memory circuit, a pixel driver that controls the digital pixel, and a digital logic circuit that performs a digital signal processing operation on a digital signal output from the digital pixel. The photo detector and a first portion of the comparator are formed in a first semiconductor die, a second portion of the comparator, the memory circuit, and the pixel driver are formed in a second semiconductor die under the first semiconductor die, and the digital logic circuit is formed in a third semiconductor die under the second semiconductor die.

20 Claims, 21 Drawing Sheets

(56) References Cited

U.S. PATENT DOCUMENTS

| | | |
|---|---|---|
| 9,607,971 B2 * | 3/2017 | Asayama ............... H04N 5/378 |
| 9,652,575 B2 | 5/2017 | Shen |
| 9,749,569 B2 | 8/2017 | Mabuchi et al. |
| 9,774,801 B2 | 9/2017 | Hseih et al. |
| 9,818,791 B1 | 11/2017 | Mao et al. |
| 10,021,331 B2 | 7/2018 | Sakakibara et al. |
| 2003/0161171 A1 * | 8/2003 | Haeberli ................ G11C 16/30 365/45 |
| 2004/0141079 A1 | 7/2004 | Yamaguchi et al. |
| 2010/0208112 A1 * | 8/2010 | Lim ....................... G11C 7/106 348/294 |
| 2010/0276572 A1 * | 11/2010 | Iwabuchi ............. H01L 23/481 257/443 |
| 2014/0203956 A1 | 7/2014 | Meynants et al. |
| 2016/0365374 A1 | 12/2016 | Park et al. |
| 2017/0098680 A1 | 4/2017 | Roh et al. |
| 2017/0171482 A1 * | 6/2017 | Wakabayashi ....... H04N 5/3745 |
| 2017/0272678 A1 * | 9/2017 | Sakakibara ............ H04N 5/379 |
| 2017/0317061 A1 | 11/2017 | Takahashi et al. |
| 2017/0332022 A1 | 11/2017 | Zhou |
| 2017/0347049 A1 | 11/2017 | Maehashi |

* cited by examiner

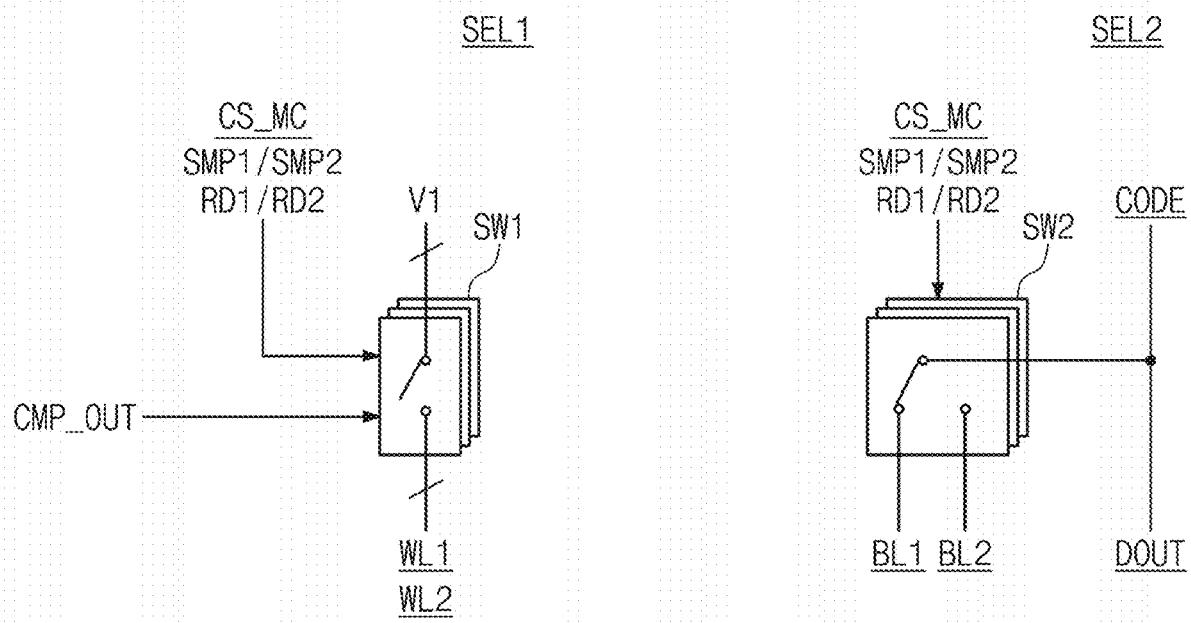

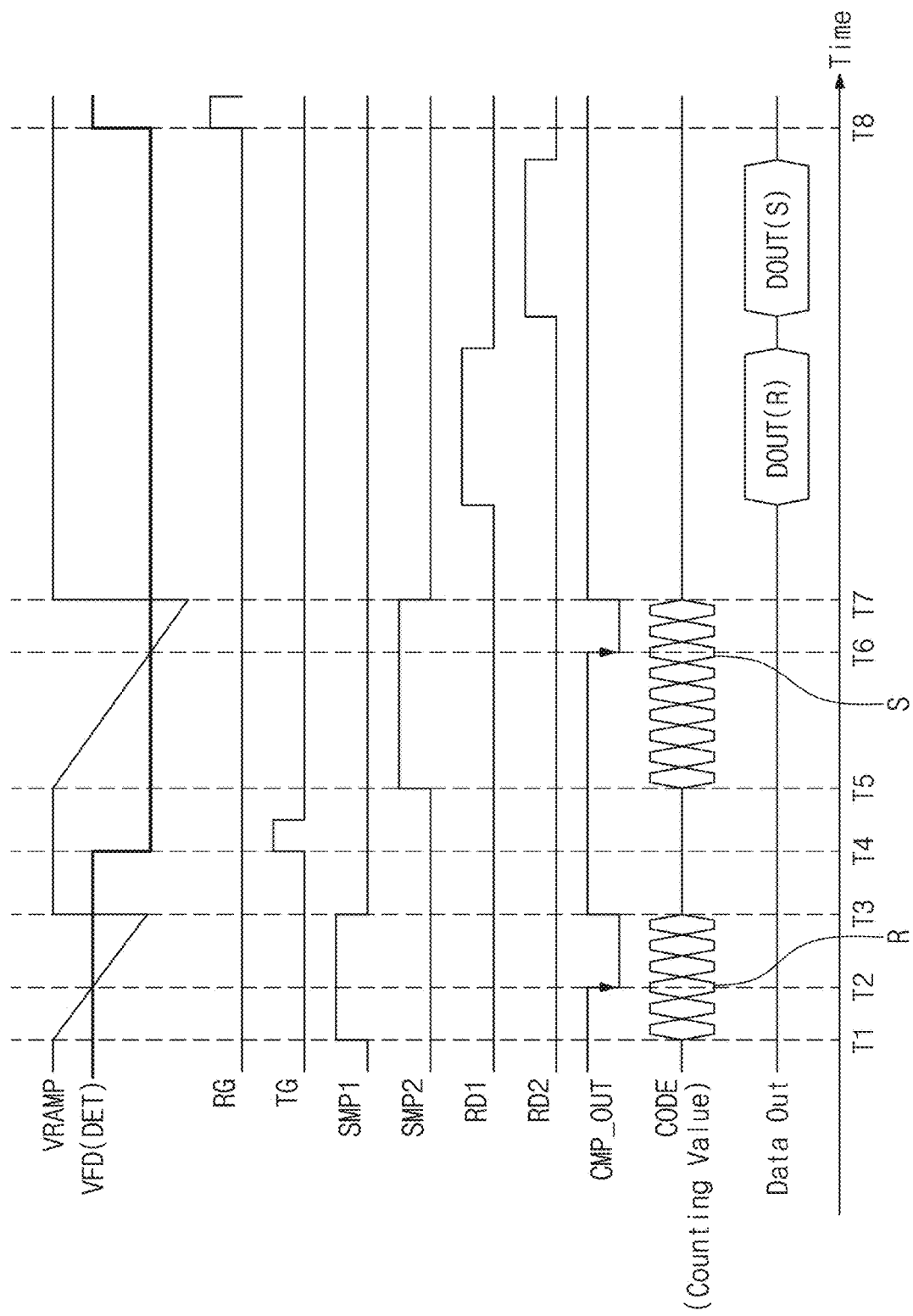

IMAGE SENSOR DEVICE

CROSS-REFERENCE TO RELATED APPLICATIONS

This application claims priority under 35 U.S.C. § 119 to Korean Patent Application No. 10-2019-0014876 filed on Feb. 8, 2019, in the Korean Intellectual Property Office, the disclosure of which is incorporated by reference herein in its entirety.

BACKGROUND

Example embodiments of the inventive concepts disclosed herein relate to a semiconductor device. For example at least some example embodiments relate to an image sensor.

An image sensor may convert a light signal into an electrical signal. As a computer industry and a communication industry develop, nowadays, there is an increasing demand for a high-performance image sensor in various electronic devices such as a digital camera, a camcorder, a personal communication system (PCS), a game console, a security camera, a medical micro camera, or the like.

A conventional image sensor may operate based on analog pixels. The analog pixels output analog signals corresponding to the light signal, and the analog signals are converted into digital signals. However, the analog signals may be are vulnerable to a noise or coupling in comparison with the digital signals and may have problems with regard to the processing of high-resolution image signals.

SUMMARY

Example embodiments of the inventive concepts provide an image sensor device having improved reliability, improved performance, and reduced costs.

According to an example embodiment, an image sensor device includes a digital pixel including a photo detector, a comparator, and a memory circuit; a pixel driver configured to control the digital pixel; and a digital logic circuit configured to perform a digital signal processing operation on a digital signal output from the digital pixel, the photo detector and a first portion of the comparator are formed in a first semiconductor die, a second portion of the comparator, the memory circuit, and the pixel driver are formed in a second semiconductor die under the first semiconductor die, and the digital logic circuit is formed in a third semiconductor die under the second semiconductor die According to an example embodiment, an image sensor device includes a digital pixel including a photo detector, a comparator, and a memory circuit; a pixel driver configured to control the digital pixel; and a digital logic circuit configured to perform a digital signal processing operation on a digital signal output from the digital pixel, the photo detector, a first portion of the comparator, and a first portion of the pixel driver are formed in a first semiconductor die, a second portion of the comparator, the memory circuit, and a second portion of the pixel driver are formed in a second semiconductor die under the first semiconductor die, and the digital logic circuit is formed in a third semiconductor die under the second semiconductor die.

According to an example embodiment, an image sensor device includes a first semiconductor die including a first portion of a digital pixel; a second semiconductor die disposed under the first semiconductor die, the second semiconductor die including a second portion of the digital pixel; first connection structures configured to connect the second portion of the digital pixel with the first portion of the digital pixel; a third semiconductor die disposed under the second semiconductor die, the third semiconductor die including a digital logic circuit, the digital logic circuit configured to receive a digital signal from the second portion of the digital pixel; and second connection structures configured to connect the digital logic circuit with the second portion of the digital pixel.

BRIEF DESCRIPTION OF THE FIGURES

The above and other objects and features of example embodiments of the inventive concepts will become apparent by describing in detail example embodiments thereof with reference to the accompanying drawings.

FIGS. 3A and 3B are circuit diagrams illustrating a digital pixel of FIG. 2A.

FIG. 4 is a timing diagram for describing an operation of a digital pixel of FIG. 3A.

DETAILED DESCRIPTION

Below, example embodiments of the inventive concepts may be described in detail and clearly to such an extent that an ordinary one in the art easily implements the inventive concepts.

Figure 1:
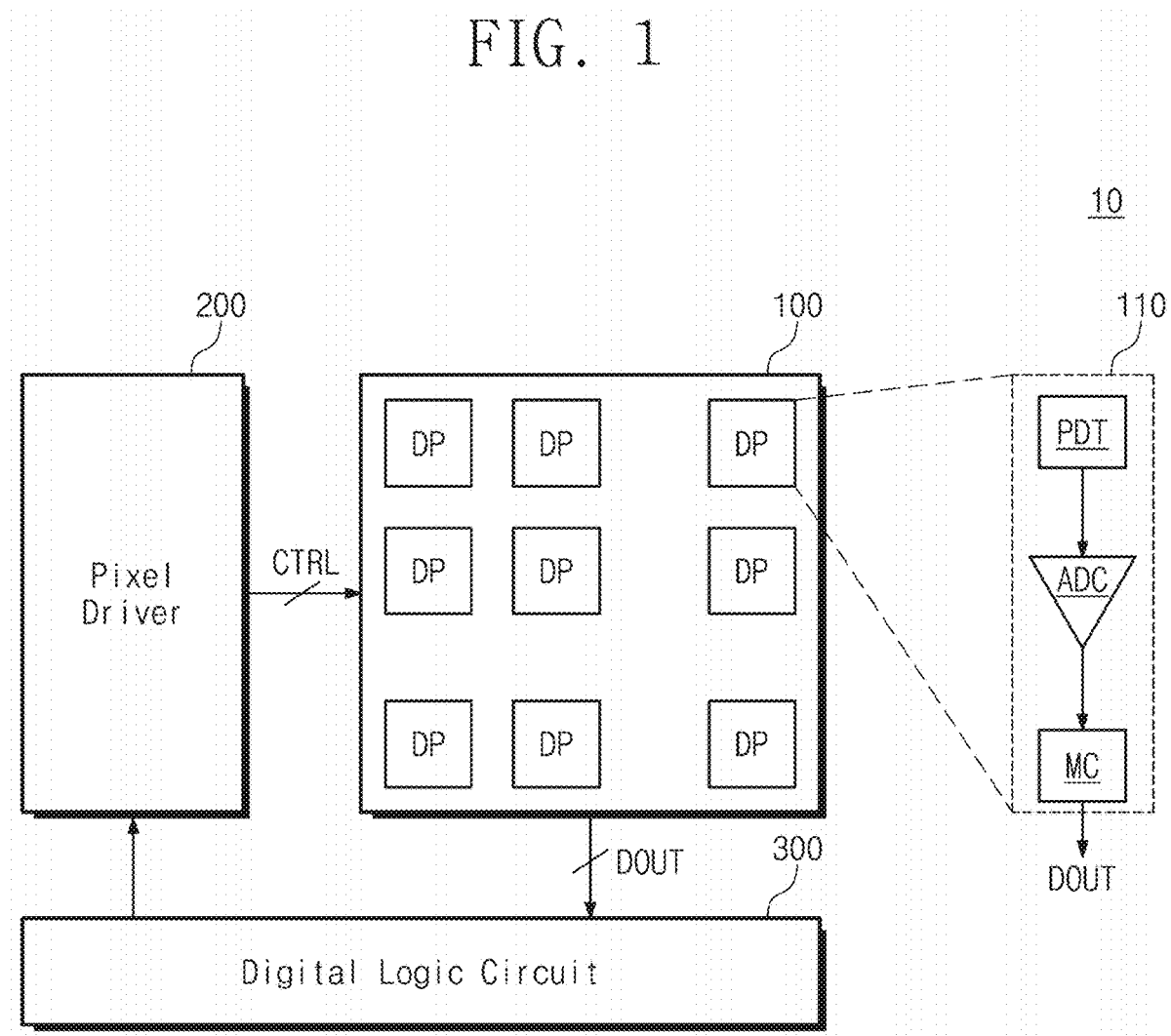
FIG. 1 is a block diagram illustrating an image sensor device according to an example embodiment of the inventive concepts.

FIG. 1 is a block diagram illustrating an image sensor device according to an example embodiment of the inventive concepts. Referring to FIG. 1, an image sensor device 10 may include a pixel array 100, a pixel driver 200, and a digital logic circuit 300.

In a conventional CMOS image sensor (CIS), image pixels may convert a light signal into analog signals, and an analog-to-digital conversion circuit may convert the analog signals into digital signals in the unit of a column. In this case, a noise or coupling may occur while the analog signals are transmitted from the CIS-based image pixels to the analog-to-digital conversion circuit, thereby reducing the quality of a final image.

In contrast, the pixel array 100 according to an example embodiment of the inventive concepts may include a plurality of digital pixels (DP) 110. Each of the digital pixels 110 may be configured to sense a light signal from the outside and to output a digital signal DOUT corresponding to the sensed light signal.

For example, the digital pixel 110 may include a photo detector PDT, an analog-to-digital converter ADC, and memory cells MC. The photo detector PDT may be configured to convert a light signal sensed from the outside into an electrical signal, that is, an analog signal. The analog-to-digital converter ADC may be configured to convert the analog signal output from the photo detector PDT into a digital signal. The memory cells MC may store the digital signal converted by the analog-to-digital converter ADC. The memory cells MC included in each digital pixel DP may be configured to output the stored digital signal DOUT under control of the pixel driver 200.

The pixel driver 200 may output a control signal CTRL for controlling the plurality of digital pixels 110 included in the pixel array 100. Based on the control signal CTRL from the pixel driver 200, each of the plurality of digital pixels 110 may perform a series of pixel operations or image detecting operations such as an operation of detecting a light signal to generate an analog signal; an operation of converting the analog signal into a digital signal; an operation of storing the digital signal; and an operation of outputting the stored digital signal.

The digital logic circuit 300 may perform digital signal processing on the digital signals DOUT received from the pixel array 100 and may provide a final image signal IMG to an external device (e.g., an image signal processor (ISP) or an application processor (AP)).

As described above, unlike the conventional CIS device, each of the plurality of digital pixels 110 may generate the digital signal DOUT at a pixel level. This may make it possible to reduce the likelihood of noise or the like modifying the digital signals DOUT from the plurality of digital pixels 110 and to process an image signal at high speed.

Figure 2A:
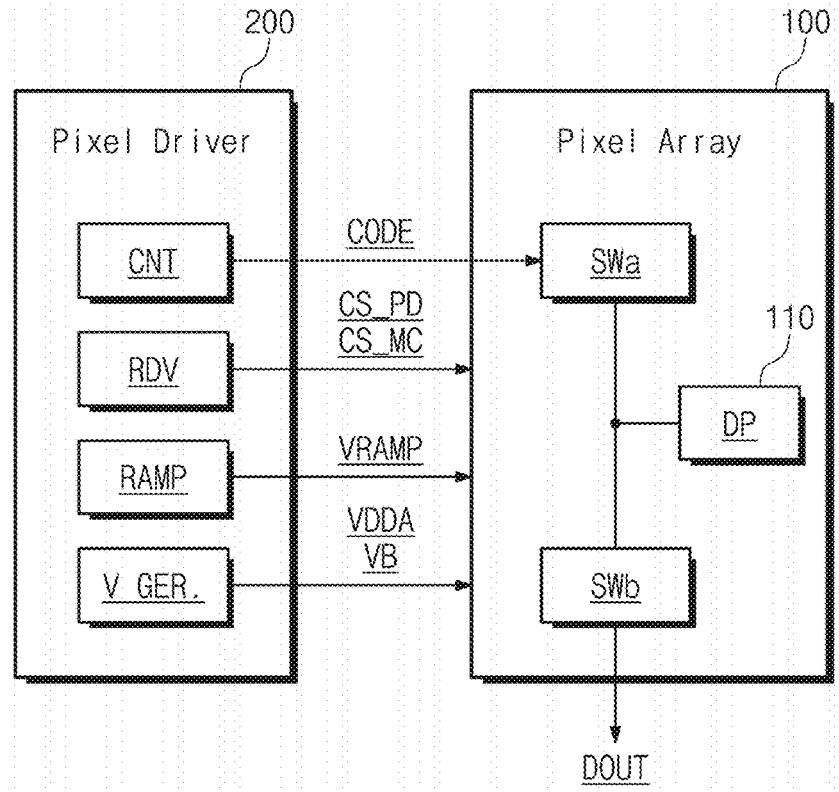
FIG. 2A is a block diagram illustrating a pixel driver of FIG. 1.
Figure 2B:
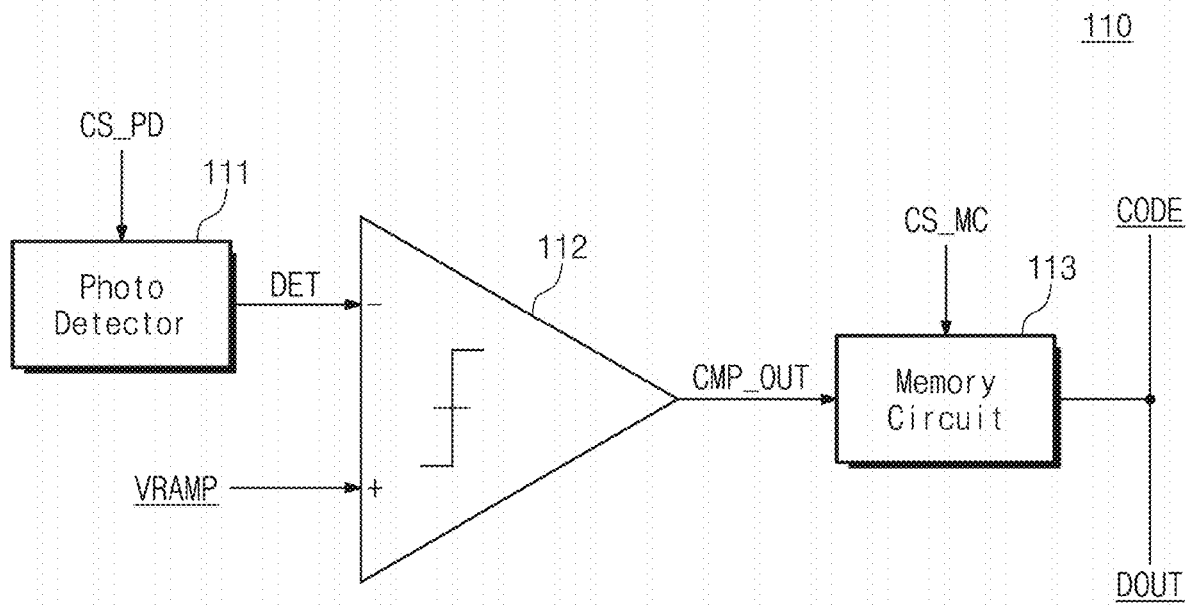
FIG. 2B is a block diagram illustrating a digital pixel of FIG. 1.

FIG. 2A is a block diagram illustrating a pixel driver of FIG. 1, and FIG. 2B is a block diagram illustrating a digital pixel of FIG. 1. Referring to FIGS. 1 to 2B, the pixel driver 200 may include a row driver RDV, a counter CNT, a ramp generator RAMP, and a voltage generator V_GER.

The row driver RDV may output a photo detector control signal CS_PD and a memory control signal CS_MC. The counter CNT may output a code "CODE". For example, the counter CNT may sequentially increase or sequentially decrease a value of the code "CODE" in response to a desired (or, alternatively, a predefined) clock (e.g., an operating clock) during a desired (or, alternatively, a predefined) time. That is, a value of the code "CODE" may sequentially vary over time.

The ramp generator RAMP may output a ramp signal VRAMP. The ramp signal VRAMP may be used as a reference signal targeted for comparison with an analog signal at the digital pixel 110. In an example embodiment, the ramp signal VRAMP may be a uniformly increasing or decreasing signal (i.e., a signal increasing/decreasing with a single slope).

The voltage generator V_GER may be configured to generate various voltages (e.g., a power supply voltage VDDA and a bias voltage VB) for the image sensor device 10 to operate.

In an example embodiment, the photo detector control signal CS_PD, the memory control signal CS_MC, the code "CODE", and the ramp signal VRAMP may be included in the control signal CTRL described with reference to FIG. 1.

The digital pixel 110 may operate in response to the control signal CTRL (e.g., CS_PD, CS_MC, CODE, and/or VRAMP) output from the pixel driver 200. For example, the digital pixel 110 may include a photo detector 111, a comparator 112, and a memory circuit 113.

The photo detector 111 may detect a light signal incident from the outside and may output a detection signal DET corresponding to the detected light signal. For example, in response to the photo detector control signal CS_PD from the row driver RDV, the photo detector 111 may detect a light signal and may output the detection signal DET corresponding to the detected light signal. In an example embodiment, the detection signal DET may be an analog signal.

The comparator 112 may compare the detection signal DET and the ramp signal VRAMP to output a comparison signal CMP_OUT. For example, when the ramp signal VRAMP is higher than the detection signal DET, the comparison signal CMP_OUT may be set to a high level; when the ramp signal VRAMP is lower than the detection signal DET, the comparison signal CMP_OUT may be set to a low level. However, example embodiments of the inventive concepts are not limited thereto.

The memory circuit 113 may be configured to store the code "CODE" in response to the comparison signal CMP_OUT and the memory control signal CS_MC or to output the stored code "CODE" as the digital signal DOUT in response to the comparison signal CMP_OUT and the memory control signal CS_MC. For example, the memory circuit 113 may include a plurality of memory cells. The plurality of memory cells may be configured to store the code "CODE" in response to the comparison signal CMP_OUT and the memory control signal CS_MC. The memory cells in the memory circuit 113 may output the stored code "CODE" as the digital signal DOUT in response to the memory control signal CS_MC.

In an example embodiment, the pixel array 100 may include the digital pixel 110 and first and second switch circuits SWa and SWb. For example, the first switch circuit SWa may be configured to transfer the code "CODE" to the digital pixel 110 in response to the memory control signal CS_MC. The second switch circuit SWb may be configured to transfer the digital signal DOUT from the digital pixel 110 to the outside (e.g., the digital logic circuit 300) in response to the memory control signal CS_MC.

In an example embodiment, in the above sampling operation (i.e., an operation in which the memory circuit 113 stores the code "CODE") of the digital pixel 110, the first switch circuit SWa may be turned on, and the second switch circuit SWb may be turned off. Thereby, the code "CODE" may be provided to the memory circuit 113. In the above output operation (i.e., an operation in which the memory circuit 113 outputs the stored code "CODE") of the digital pixel 110, the first switch circuit SWa may be turned off and the second switch circuit SWb may be turned on. Thereby, the code "CODE" stored in the memory circuit 113 may be output as the digital signal DOUT.

For convenience of description, a configuration of the first and second switch circuits SWa and SWb are omitted in example embodiments below. However, example embodiments of the inventive concepts are not limited thereto. For example, the code "CODE" and the digital signal DOUT may share the same signal line within the pixel array 100, and may be controlled by a separate switch circuit (e.g., SWa or SWb) that operates based on an operation of each digital pixel.

Figure 3A:
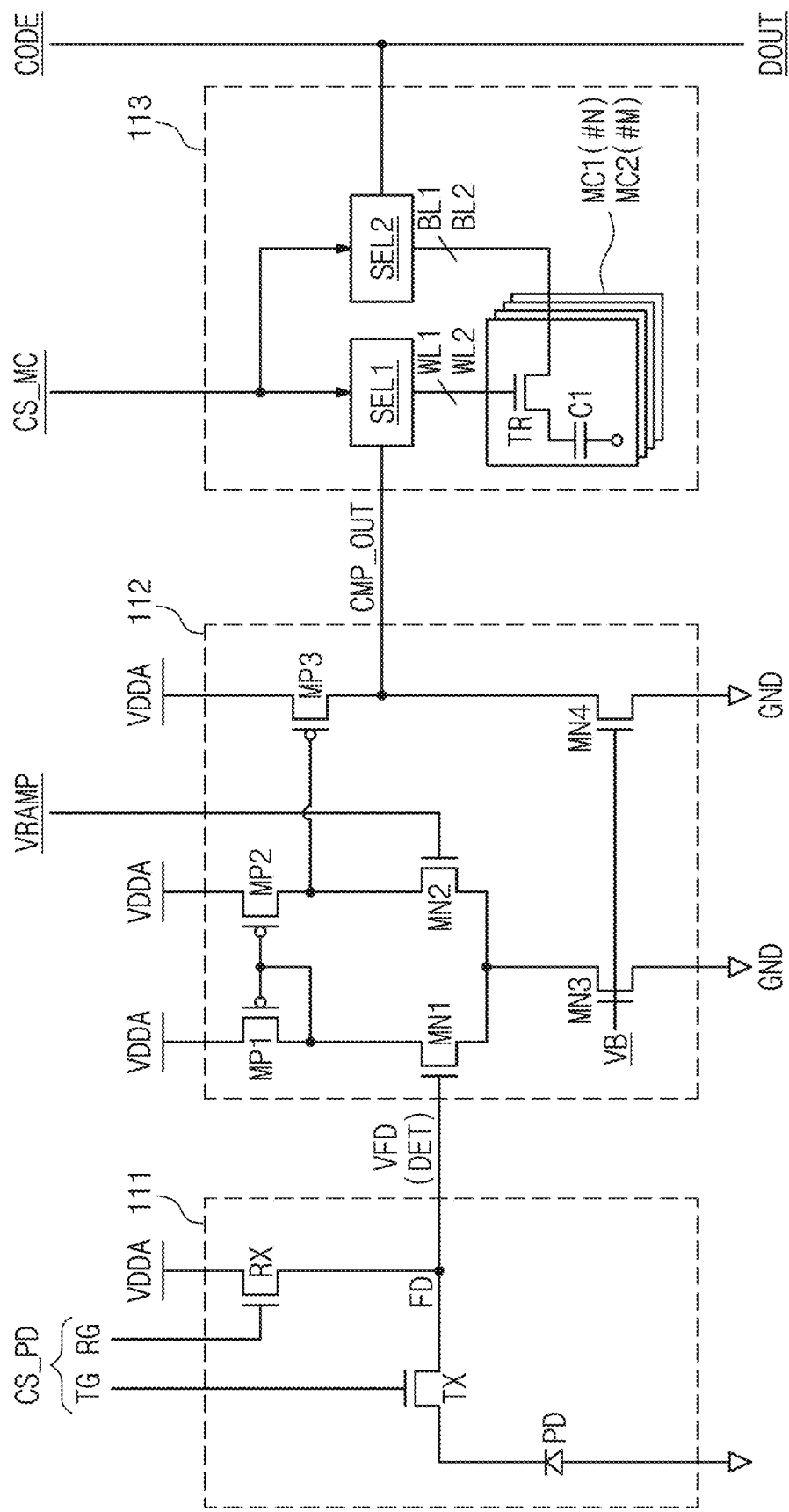

FIGS. 3A and 3B are circuit diagrams illustrating a digital pixel of FIG. 2A. Below, to describe an example embodiment of the inventive concepts clearly, a structure and an operation of the digital pixel 110 will be described with reference to an example circuit diagram, but the inventive concepts are not limited thereto. For example, the digital pixel 110 may be modified in various forms.

Referring to FIGS. 2A to 3B, the digital pixel 110 may include the photo detector 111, the comparator 112, and the memory circuit 113. The photo detector 111 may include a photo diode PD, a transfer transistor TX, and a reset transistor RX. The photo diode PD may be configured to accumulate charges in response to a light signal incoming from the outside.

The transfer transistor TX may be connected between a floating diffusion node FD and the photo diode PD and may operate in response to a transfer signal TG. For example, the transfer transistor TX may be configured to transfer the charges accumulated in the photo diode PD to the floating diffusion node FD in response to the transfer signal TG.

The reset transistor RX may be connected between the power supply voltage VDDA and the floating diffusion node FD and may operate in response to a reset signal RG. For example, the reset transistor RX may reset a voltage level of the floating diffusion node FD in response to the reset signal RG.

In an example embodiment, the structure or configuration of the photo detector 111 of FIG. 3A is an example, and example embodiments of the inventive concepts are not limited thereto. The photo detector 111 may be implemented to have any one of various pixels structures (e.g., a 1T structure, a 2T structure, a 3T structure, etc.) for detecting a light signal and outputting an analog signal corresponding to the detected light signal.

The comparator 112 may be configured to compare a detection signal DET (or a voltage VFD of the floating diffusion node FD) from the photo detector 111 and the ramp signal VRAMP and to output the comparison signal CMP_OUT based on a comparison result. The comparator 112 may be implemented with a low-power comparator. For example, the comparator 112 may include first to third PMOS transistors MP1 to MP3 and first to fourth MN1 to MN4.

The first PMOS transistor MP1, the first NMOS transistor MN1, and the third NMOS transistor MN3 may be connected in series between the power supply voltage VDDA and a ground voltage GND. A gate of the first PMOS transistor MP1 may be connected to a node between the first PMOS transistor MP1 and the first NMOS transistor MN1. A gate of the first NMOS transistor MN1 may be connected to the floating diffusion node FD and may be configured to receive the detection signal DET. A gate of the third NMOS transistor MN3 may be configured to receive a bias voltage VB.

The second PMOS transistor MP2 and the second NMOS transistor MN2 may be connected in series between the power supply voltage VDDA and one end of the third NMOS transistor MN3. A gate of the second PMOS transistor MP2 may be connected to the gate of the first PMOS transistor MP1. A gate of the second NMOS transistor MN2 may be configured to receive the ramp signal VRAMP.

The third PMOS transistor MP3 and the fourth NMOS transistor MN4 may be connected in series between the power supply voltage VDDA and the ground voltage GND. A gate of the third PMOS transistor MP3 may be connected to a node between the second PMOS transistor MP2 and the second NMOS transistor MN2. A gate of the fourth NMOS transistor MN4 may be configured to receive the bias voltage VB.

In an example embodiment, the structure of the comparator 112 of FIG. 3A is an example, and example embodiments of the inventive concepts are not limited thereto. The comparator 112 may have structures of various comparators or differential amplifiers configured to compare the detection signal DET and the ramp signal VRAMP and to output the comparison signal CMP_OUT based on a comparison signal.

The memory circuit 113 may operate in response to the comparison signal CMP_OUT, the memory control signal CS_MC, and the code "CODE". For example, the memory circuit 113 may include a first selection circuit SEL1, a second selection circuit SEL2, and a plurality of memory cells MC1 and MC2.

Each of the plurality of memory cells MC1 and MC2 may be a dynamic random access memory (DRAM) cell. For example, each of the plurality of memory cells MC1 and MC2 may include a selection transistor TR and a storage capacitor C1. The selection transistor TR of each of the memory cells MC1 may be connected to a bit line BL1, and the storage capacitors C1 of each of the memory cells MC1 and may operate in response to a signal of a word line WL1; the selection transistor TR of each of the memory cells MC2 may be connected to a bit lines BL2, and the storage capacitor C1 of each of the memory cells MC2 and may operate in response to a signal of a word lines WL2.

In an example embodiment, the number of the first memory cells MC1 may be "N" (N being a natural number), and the number of the second memory cells MC2 may be "M" (M being a natural number). In an example embodiment, the number "N" of first memory cells MC1 may be the same as the number "M" of second memory cells MC2.

In an example embodiment, the first memory cells MC1 may be configured to store a reset sampling value, and the second memory cells MC2 may be configured to store a signal sampling value. The first memory cells MC1 may be connected with the first word lines WL1 and the first bit lines BL1, and the second memory cells MC2 may be connected with the second word lines WL2 and the second bit lines BL2.

The first selection circuit SEL1 may control the first word lines WL1 and the second word lines WL2 in response to the comparison signal CMP_OUT and the memory control signal CS_MC. For example, as illustrated in FIG. 3B, the first selection circuit SEL1 may include first switches SW1. The first switches SW1 may be configured to provide a first voltage V1 to the first word lines WL1 or the second word lines WL2 in response to the comparison signal CMP_OUT and the memory control signal CS_MC. In an example embodiment, the first voltage V1 may be a high voltage enough to turn on the selection transistor TR included in each of the plurality of memory cells MC1 and MC2.

For example, the memory control signal CS_MC may include first and second sampling signals SMP1 and SMP2 and first and second read signals RD1 and RD2. The first sampling signal SMP1 may be a signal for storing the reset sampling value in the first memory cells MC1, and the second sampling signal SMP2 may be a signal for storing the signal sampling value in the second memory cells MC2. The first read signal RD1 may be a signal for outputting the reset sampling value stored in the first memory cells MC1 as the digital signal DOUT, and the second read signal RD2 may be a signal for outputting the signal sampling value stored in the second memory cells MC2 as the digital signal DOUT. However, example embodiments of the inventive concepts are not limited thereto. For example, the memory control signal CS_MC for controlling the memory circuit 113 may be variously changed or modified.

In the case where the first sampling signal SMP1 or the first read signal RD1 is activated, the first switches SW1 may provide the first voltage V1 to the first word lines WL1 in response to a falling edge (or a rising edge) of the comparison signal CMP_OUT. Thereby, the selection transistors of the first memory cells MC1 connected with the first word lines WL1 may be turned on.

In the case where the second sampling signal SMP2 or the second read signal RD2 is activated, the first switches SW1 may provide the first voltage V1 to the second word lines WL2 in response to a falling edge (or a rising edge) of the comparison signal CMP_OUT. Thereby, the selection transistors of the second memory cells MC2 connected with the second word lines WL2 may be turned on.

As described above, the first selection circuit SEL1 may select at least one of a group of the first memory cells MC1 and a group of the second memory cells MC2 in response to the comparison signal CMP_OUT and the memory control signal CS_MC.

The second selection circuit SEL2 may select the first bit lines BL1 and the second bit lines BL2 in response to the memory control signal CS_MC. For example, as illustrated in FIG. 3B, the second selection circuit SEL2 may include second switches SW2 configured to select the first bit lines BL1 and the second bit lines BL2 in response to the memory control signal CS_MC.

The second switches SW2 may be configured to select the first bit lines BL1 when the first sampling signal SMP1 or the first read signal RD1 is activated. In this case, signal lines and the first bit lines BL1 may be electrically connected to each other. In an example embodiment, in the case where the first sampling signal SMP1 is activated, the first switch circuit SWa of FIG. 2A may be turned on, and thus, the code "CODE" may be provided to the signal lines. That is, in the case where the first sampling signal SMP1 is activated, the code "CODE" may be provided to the first memory cells MC1 connected with the first bit lines BL1. In an example embodiment, in the case where the first read signal RD1 is activated, the second switch circuit SWb of FIG. 2A may be turned on, and thus, the code "CODE" stored in the first memory cells MC1 connected with the first bit lines BL1 may be output to the signal lines.

The second switches SW2 may be configured to select the second bit lines BL2 when the second sampling signal SMP2 or the second read signal RD2 is activated. In this case, the signal lines and the second bit lines BL2 may be electrically connected to each other. In an example embodiment, in the case where the second sampling signal SMP2 is activated, the first switch circuit SWa of FIG. 2A may be turned on, and thus, the code "CODE" may be provided to the signal lines. That is, in the case where the second sampling signal SMP2 is activated, the code "CODE" may be provided to the second memory cells MC2 connected with the second bit lines BL2. In an example embodiment, in the case where the second read signal RD2 is activated, the second switch circuit SWb of FIG. 2A may be turned on, and thus, the code "CODE" stored in the second memory cells MC2 connected with the second bit lines BL2 may be output to the signal lines.

Although not clearly illustrated in drawings, the signal lines may be shared by digital pixels, which are arranged in the same column, from among the plurality of digital pixels 110 of the pixel array 100.

Although not clearly illustrated in drawings, in an example embodiment, the first and second selection circuits SEL1 and SEL2 may be configured to control a plurality of memory cells included in any other digital pixels that operate at the same timing. In other words, at least two or more digital pixels of the plurality of digital pixels 110 may be configured to share the first and second selection circuits SEL1 and SEL2 that are separately provided. In this case, a memory cell of each of the at least two or more digital pixels may not include the first and second selection circuits SEL1 and SEL2.

Although not clearly illustrated in drawings, all or a part of the first and second selection circuits SEL1 and SEL2 and the first and second switch circuits SWa and SWb (refer to FIG. 2A) may be implemented with a separate switch block, which is formed in the pixel array 100 or at a separate position.

FIG. 4 is a timing diagram for describing an operation of a digital pixel of FIG. 3A. For brevity of illustration and for convenience of description, components that are unnecessary to describe example embodiments of the inventive concepts are omitted. Also, with regard to the above components, additional description will be omitted to avoid redundancy. Furthermore, the timing diagram illustrated in FIG. 4 may be an example, and the example embodiments of the inventive concepts are not limited thereto.

Referring to FIGS. 2A to 4, the first sampling signal SMP1 may be activated during a time period from a first time T1 to a third time T3. That is, during the time period from the first time T1 to the third time T3, a reset sampling operation may be performed on a reset level of the photo detector 111.

For example, during the activation of the first sampling signal SMP1, the ramp signal generator RAMP may output the ramp signal VRAMP that decreases uniformly (i.e., decreases at a single slope), and the counter CNT may sequentially output the code "CODE", a value of which increases or decreases at a given interval. In this case, at a second time T2, a level of the ramp signal VRAMP may become smaller than a level (i.e., VFD) of the floating diffusion node FD. In this case, the output signal CMP_OUT of the comparator 112 may transition from the high level to the low level.

Because the first sampling signal SMP1 is in an active state at a falling edge (i.e., the second time T2) of the output signal CMP_OUT of the comparator 112, the code "CODE" may be provided to the first bit lines BL1 by the second selection circuit SEL2, and the selection transistors TR of the first memory cells MC1 may be turned on by the first selection circuit SEL1 That is, a value "R" of the code "CODE" may be stored in the first memory cells MC1 at the second time T2.

Afterwards, the transfer transistor TX of the photo detector 111 may be turned on in response to the transfer signal TG activated at a fourth time T4, and thus charges accumulated by a photo diode PD may be transferred to the floating diffusion node FD. Thereby, at the time T4, the level (i.e., VFD) of the floating diffusion node FD may decrease as much as a level corresponding to the transferred charges.

Afterwards, the second sampling signal SMP2 may be activated during a time period from a fifth time T5 to a seventh time T7. That is, during the time period from the fifth time T5 to the seventh time T7, a signal sampling operation may be performed on the detection signal DET from the photo detector 111.

As in the above description, for example, during the activation of the second sampling signal SMP2, the ramp signal generator RAMP may output the ramp signal VRAMP, and the counter CNT may output the code "CODE". At the sixth time T6, the detection signal DET may become lower than the ramp signal VRAMP. In this case, the output signal CMP_OUT of the comparator 112 may transition from the high level to the low level.

Because the second sampling signal SMP2 is in an active state at a falling edge (i.e., the sixth time T6) of the output signal CMP_OUT of the comparator 112, the code "CODE" may be provided to the second bit lines BL2 by the second selection circuit SEL2, and the selection transistors TR of the second memory cells MC2 may be turned on by the first selection circuit SEL1. That is, a value "S" of the code "CODE" may be stored in the second memory cells MC2 at the sixth time T6.

Afterwards, during activation of the first read signal RD1, the selection transistors TR of the first memory cells MC1 may be turned on by the first selection circuit SEL1, and the first bit lines BL1 may be connected with output signal lines by the second selection circuit SEL2. In this case, the value "R" (i.e., a reset sampling value) stored in the first memory cells MC1 may be output as the digital signal DOUT.

Afterwards, during activation of the second read signal RD2, the selection transistors TR of the second memory cells MC2 may be turned on by the first selection circuit SEL1, and the second bit lines BL2 may be connected with the output signal lines by the second selection circuit SEL2. In this case, the value "S" (i.e., a signal sampling value) stored in the second memory cells MC2 may be output as the digital signal DOUT.

Afterwards, at an eighth time T8, the reset transistor RX may be turned on in response to activation of the reset signal RG, and thus the level VFD of the floating diffusion node FD may be reset.

The operation of the digital pixel 110 described with reference to FIG. 4 is an example, and example embodiments of the inventive concepts are not limited thereto. Signals (e.g., CS_PD and CS_MC) for controlling the digital pixel 110 may be variously changed or modified according to a driving way and structure of the digital pixel 110.

FIGS. 5A to 5D are diagrams illustrating a digital pixel according to example embodiments of the inventive concepts. Various structures of a digital pixel according to example embodiments of the inventive concepts will be described with reference to FIGS. 5A to 5D, but example embodiments of the inventive concepts are not limited thereto.

Below, for brevity of illustration and for convenience of description, with regard to components that are the same as or similar to the above components, additional description will be omitted to avoid redundancy. Components that will not be described below may be implemented through each of all example embodiments disclosed in the detailed description or through a combination of all the example embodiments.

Figure 5A:
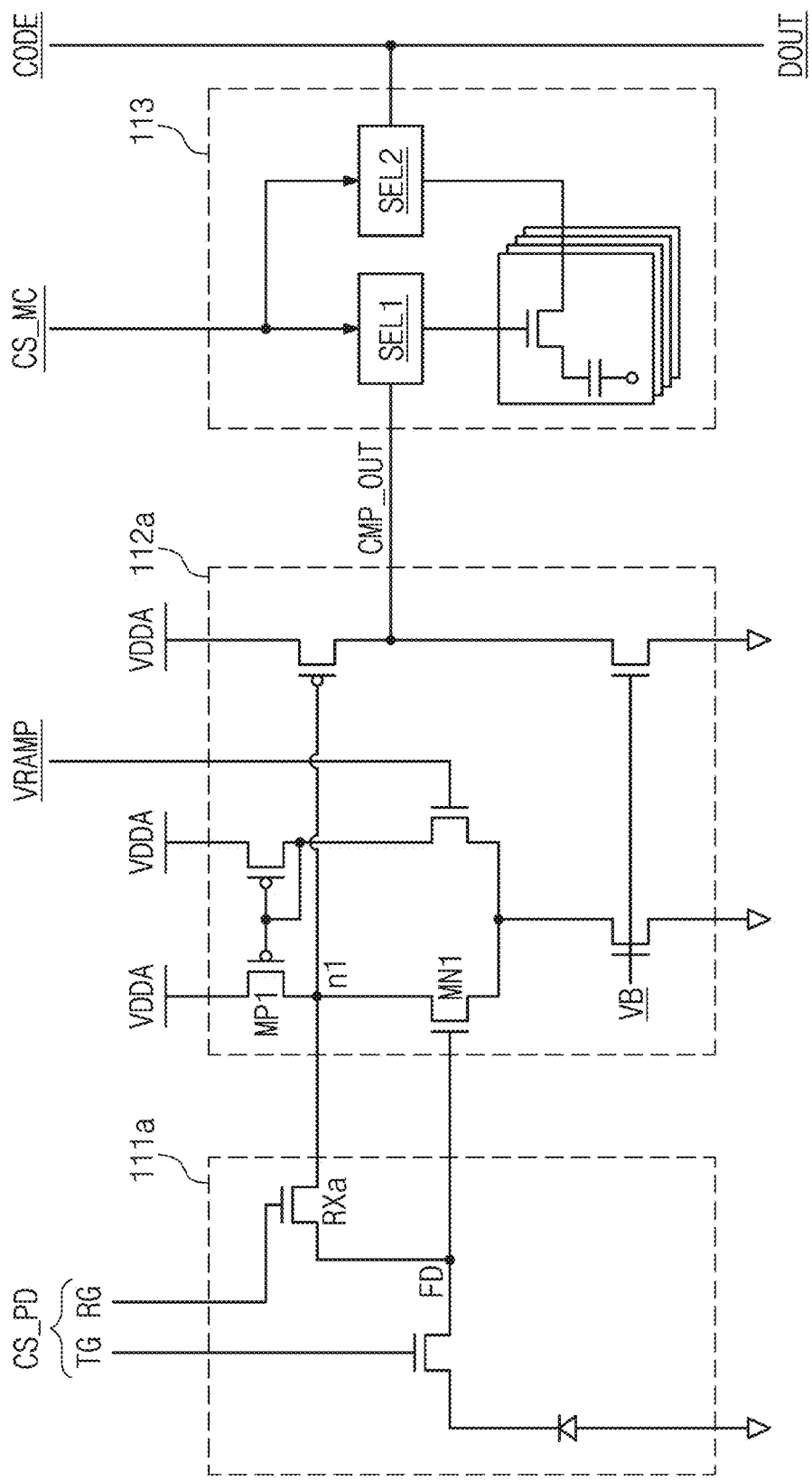
FIGS. 5A to 5D are diagrams illustrating a digital pixel according to example embodiments of the inventive concepts.

Referring to FIG. 5A, a digital pixel 110a may include a photo detector 111a, a comparator 112a, and the memory circuit 113. The photo detector 111a may include a reset transistor RXa. Unlike the reset transistor RX of FIG. 3A, the reset transistor RXa of FIG. 5A may be connected between the floating diffusion node FD and a first node n1. The first node n1 is positioned between the first PMOS transistor MP1 and the first NMOS transistor MN1. The reset transistor RXa may reset the floating diffusion node FD to a level of the first node n1 in response to the reset signal RG.

In an example embodiment, an operation of the digital pixel 110a of FIG. 5A is similar to the operation of the digital pixel 110 of FIG. 3A except for a connection structure of the reset transistor RXa and an inversion of the comparison signal CMP_OUT, and thus, with regard to the remaining components, additional description will be omitted to avoid redundancy.

Figure 5B:
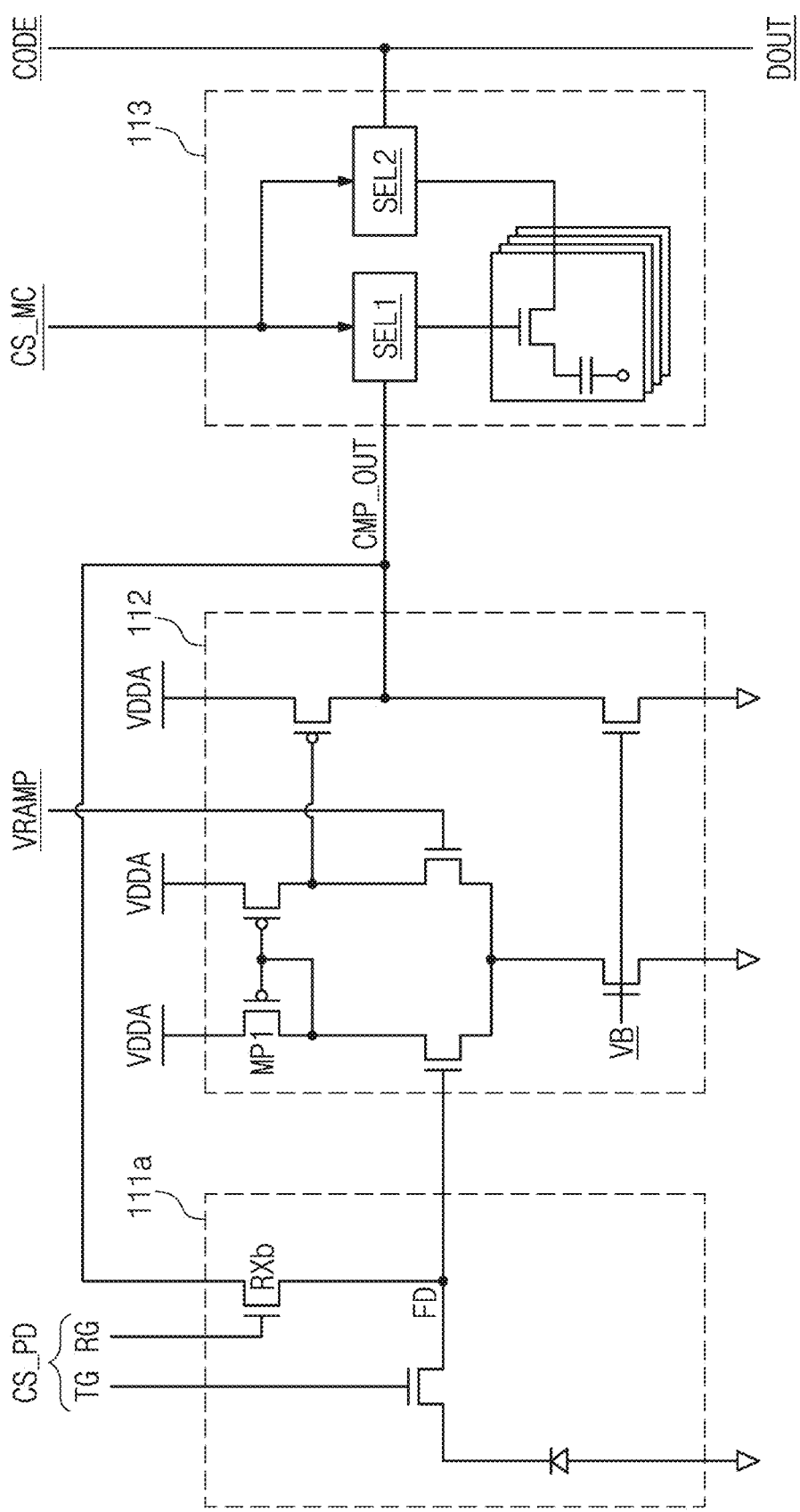

Referring to FIG. 5B, a digital pixel 110b may include a photo detector 111b, the comparator 112, and the memory circuit 113. An operation of the digital pixel 110b of FIG. 5B is similar to the operation of the digital pixel 110 of FIG. 3A except that a reset transistor RXb of the photo detector 111b resets the floating diffusion node FD by using the comparison signal CMP_OUT instead of the power supply voltage VDDA, and thus, additional description will be omitted to avoid redundancy.

Figure 5C:
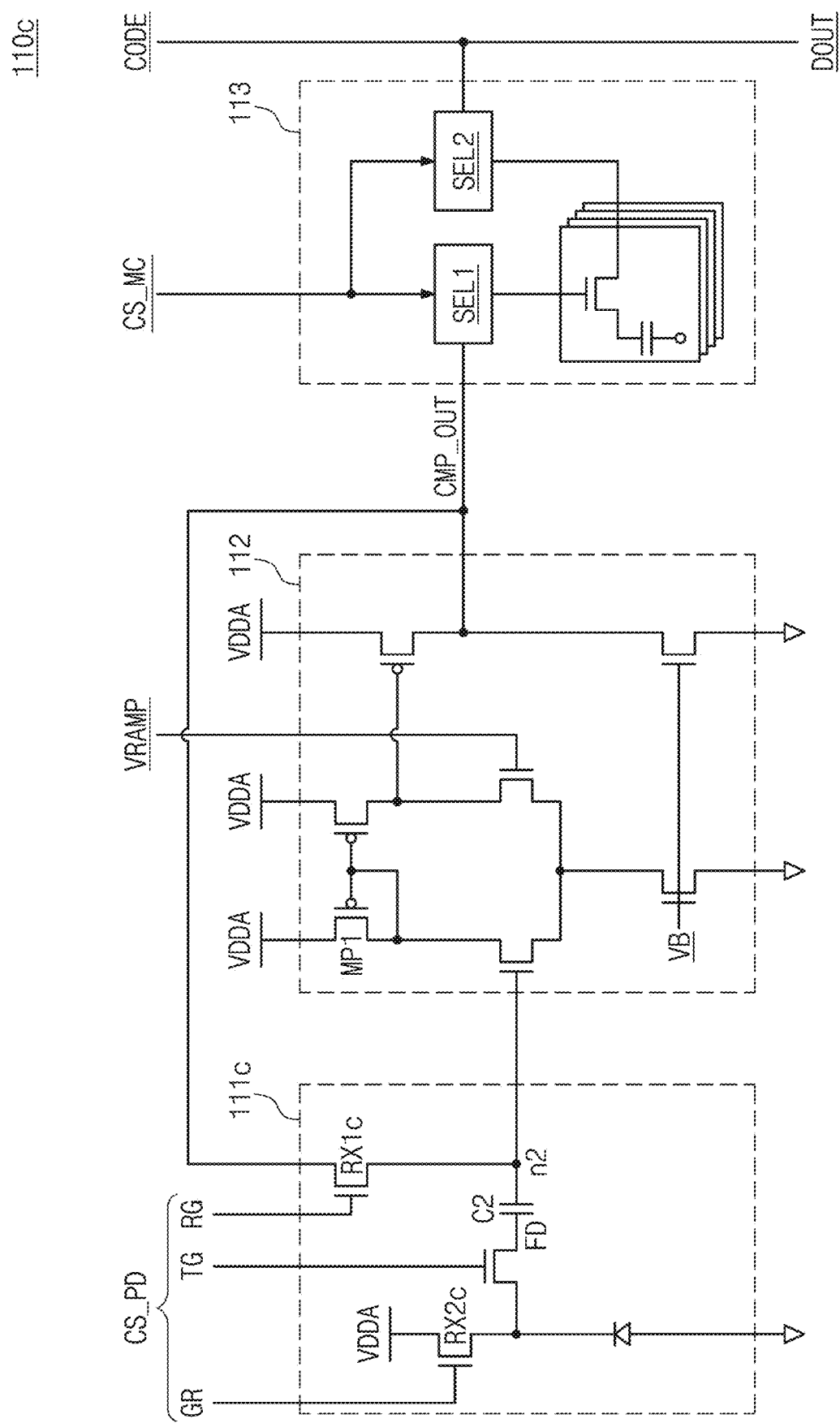

Referring to FIG. 5C, a digital pixel 110c may include a photo detector 111c, the comparator 112, and the memory circuit 113. The photo detector 111c may include a second capacitor C2 connected between the floating diffusion node FD and a second node n2. The second capacitor C2 may be a passive element, a metal oxide semiconductor (MOS) transistor, a metal insulator metal (MIM) capacitor, a cell capacitor, etc. The second capacitor C2 may be used to cancel an offset voltage that may occur in the comparator 112 due to mismatch (e.g., a difference between threshold voltages of transistors or a geometry difference of the comparator 112) of the comparator 112.

For example, a first reset transistor RX1c of the photo detector 111c may reset the second node n2 by using the comparison signal CMP_OUT in response to the reset signal RG. In this case, charges corresponding to the offset voltage of the comparator 112 may be stored in the second capacitor C2. Afterwards, because the detection signal DET to which a voltage of the capacitor C2 is added to a level of the floating diffusion node FD is output, the offset voltage of the comparator 112 may be canceled.

The photo detector 111c may further include a second reset transistor RX2c connected between the power supply voltage VDDA and the photo diode PD. The second reset transistor RX2c may reset the photo diode PD to the power supply voltage VDDA in response to a global reset signal GR. The remaining components and operations thereof are similar to the components and operations described above, and thus, additional description will be omitted to avoid redundancy.

Figure 5D:
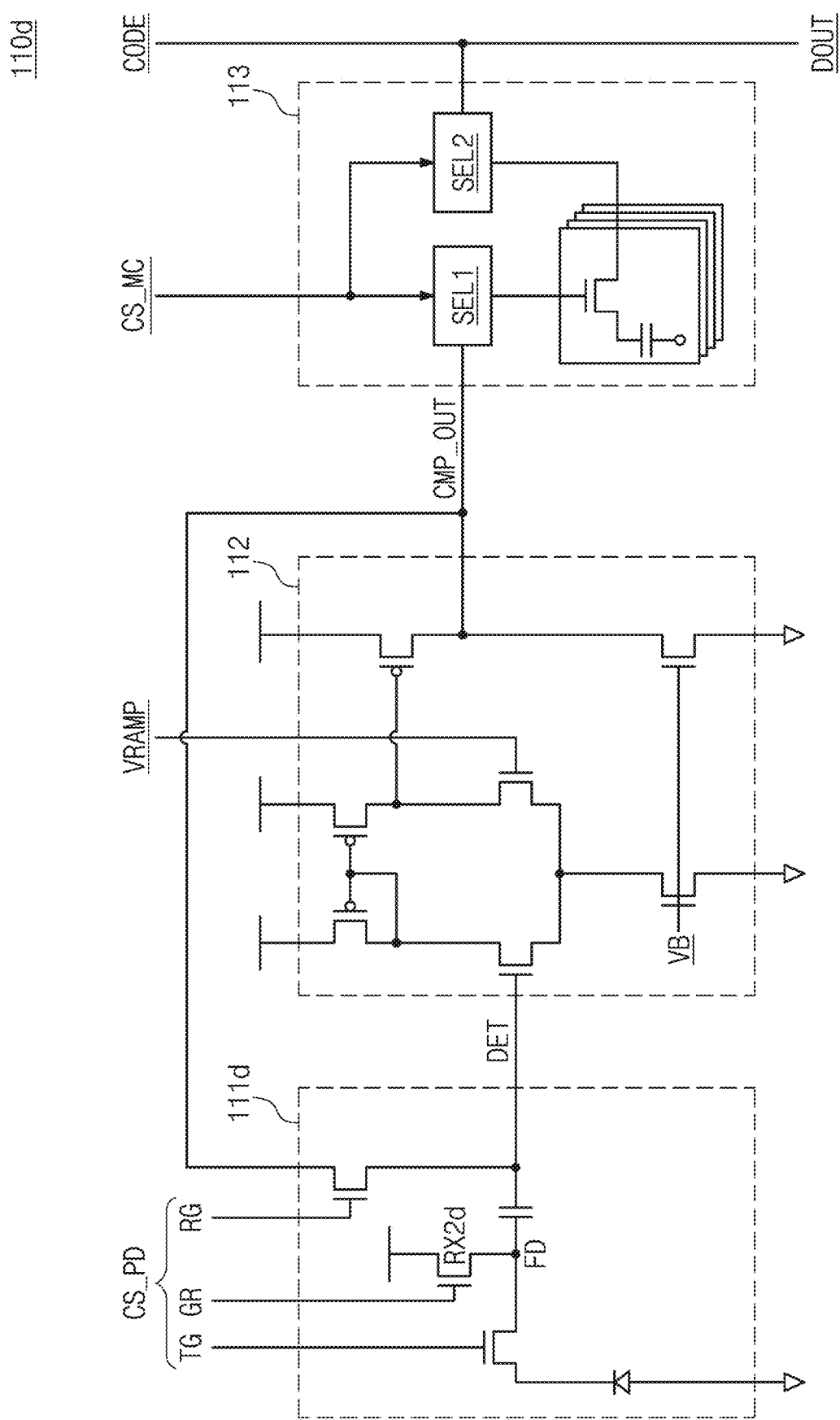

Referring to FIG. 5D, a digital pixel 110d may include a photo detector 111d, the comparator 112, and the memory circuit 113. Unlike the photo detector 111c of FIG. 5C, a second reset transistor RX2d of the photo detector 111d of FIG. 5D may be connected between the power supply voltage VDDA and the floating diffusion node FD and may operate in response to the global reset signal GR. The remaining components and operations thereof are similar to the components and operations described above, and thus, additional description will be omitted to avoid redundancy.

As described above, a structure of the digital pixel 110 according to an example embodiment of the inventive concepts may be variously changed or modified according to a way to operate, a way to implement, etc. That is, example embodiments of the inventive concepts are not limited to the example embodiments disclosed in this specification. A digital pixel according to an example embodiment of the inventive concepts may output the digital signal DOUT corresponding to a light signal detected at a pixel level. Thereby, the influence of a noise or coupling may be reduced compared with conventional image pixels outputting an analog signal, and thus, a high-resolution image may be processed accurately. This may mean that an image sensor device having improved performance is provided.

Figure 6A:
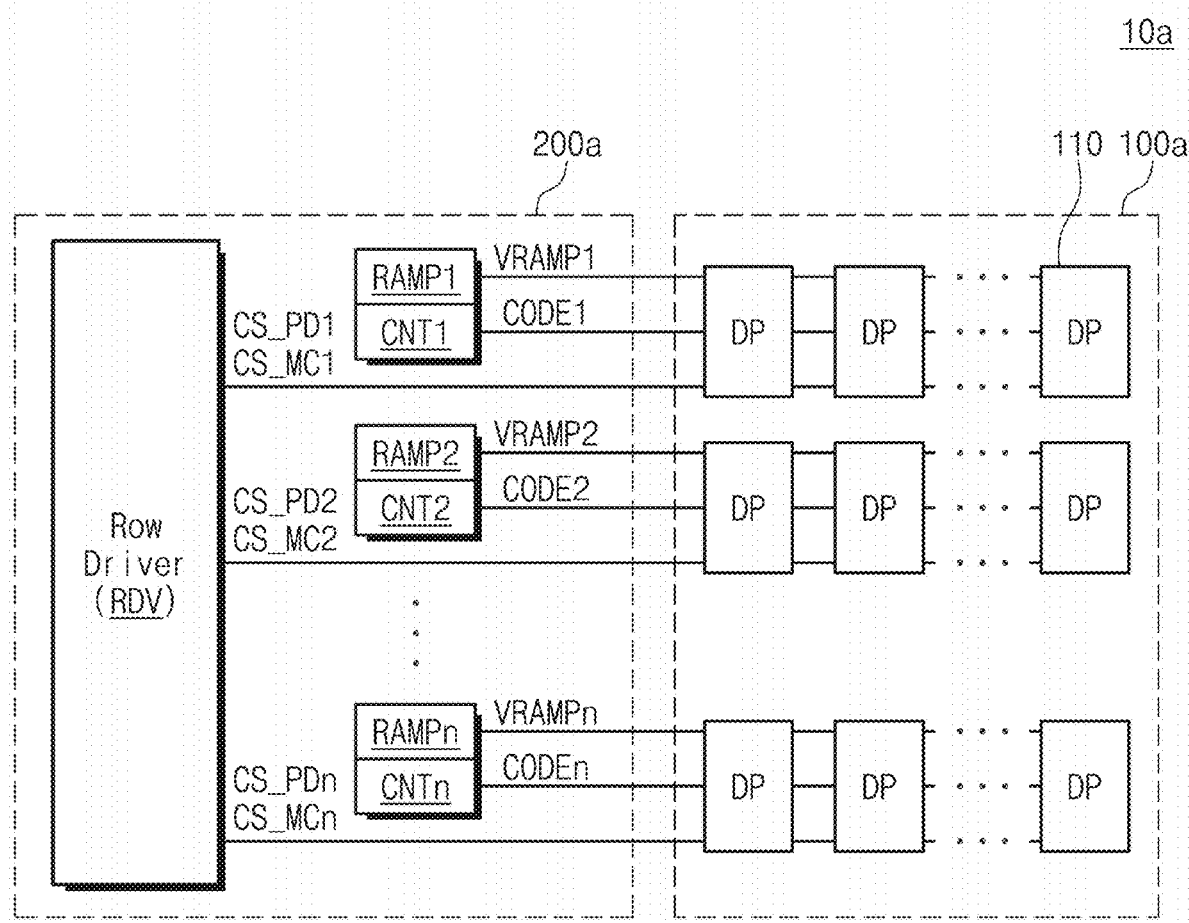
FIGS. 6A and 6B are block diagrams illustrating an image sensor device of FIG. 1.
Figure 6B:
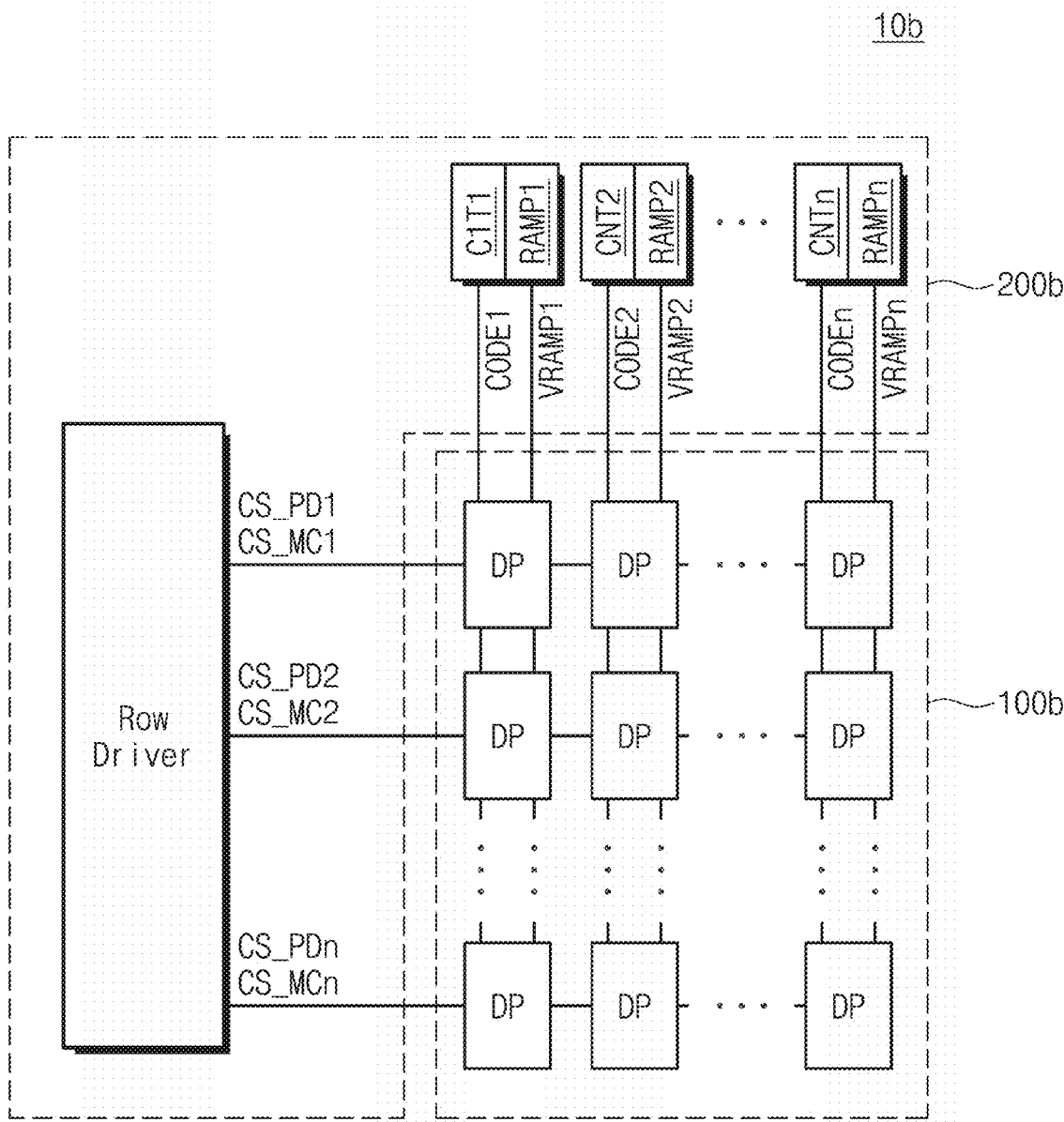

FIGS. 6A and 6B are block diagrams illustrating an image sensor device of FIG. 1. A connection relationship between a pixel driver and digital pixels will be described with reference to FIGS. 6A and 6B. For brevity of illustration and for descriptive convenience, components that are unnecessary to describe the connection relationship between the pixel driver and the digital pixels are omitted.

Referring to FIG. 6A, an image sensor device 10a may include a pixel array 100a and a pixel driver 200a. The pixel driver 200a may include the row driver RDV, a plurality of ramp generators RAMP1 to RAMPn, and a plurality of counters CNT1 to CNTn.

The row driver RDV may control the plurality of digital pixels 110 included in the pixel array 100a in the unit of a row. For example, the row driver RDV may provide the plurality of digital pixels 110 with first to n-th pixel control signals CS_PD1 to CS_PDn and first to n-th memory control signals CS_MC1 to CS_MCn in the unit of a row. The plurality of digital pixels 110 may operate in the unit of a row under control of the row driver RDV.

The plurality of digital pixels 110 may be configured to share a ramp signal and a code in the unit of a row. For example, the first to n-th ramp generators RAMP1 to RAMPn may provide the plurality of digital pixels 110 with first to n-th ramp signals VRAMP1 to VRAMPn in the unit of a row. That is, digital pixels in the same row may share the same ramp signal. The first to n-th counters CNT1 to CNTn may provide the plurality of digital pixels 110 with first to n-th codes CODE1 to CODEn in the unit of a row. That is, digital pixels in the same row may share the same code.

Referring to FIG. 6B, an image sensor device 10b may include a pixel array 100b and a pixel driver 200b. The pixel driver 200b may include the row driver RDV, the plurality of ramp generators RAMP1 to RAMPn, and the plurality of counters CNT1 to CNTn. The row driver RDV is described above, and thus, additional description will be omitted to avoid redundancy. Unlike FIG. 6A, in FIG. 6B, the plurality of digital pixels 110 may be configured to share a ramp signal and a code in the unit of a column. The image sensor device 10b is similar to the image sensor device 10a except that a ramp signal and a code are shared in the unit of a column, and thus, additional description will be omitted to avoid redundancy.

Figure 7:
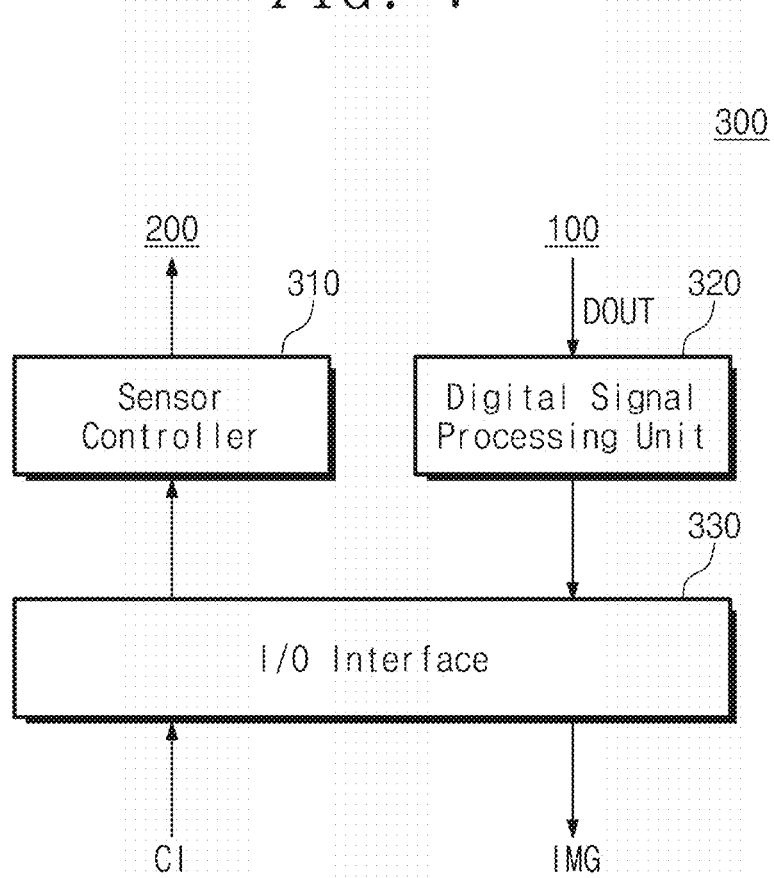
FIG. 7 is a block diagram illustrating a digital logic circuit of FIG. 1.

FIG. 7 is a block diagram illustrating a digital logic circuit of FIG. 1. Referring to FIGS. 1 and 7, the digital logic circuit 300 includes a sensor controller 310, a digital signal processing unit 320, and an input/output interface 330.

The sensor controller 310 may be configured to control overall operations of the image sensor device 10. For example, the sensor controller 310 may control overall operations of the image sensor device 10 based on control information CI provided from an external device (e.g., an ISP or an AP) through the input/output interface 330. The sensor controller 310 may be a timing controller for controlling an operation timing of the pixel driver 200. In an example embodiment, the pixel driver 200 may generate various signals described above, based on timing signals from the sensor controller 310.

The digital signal processing unit 320 may receive the digital signals DOUT from the pixel array 100 and may perform digital signal processing on the received digital signals DOUT. For example, as described above, the digital signal DOUT associated with one digital pixel 110 may include a reset sampling value "R" and a signal sampling value "S". The digital signal processing unit 320 may determine a final digital value corresponding to a light signal sensed by one digital pixel 110 by performing processing (e.g., S minus R) on the reset sampling value "R" and the signal sampling value "S". The final image data IMG may be generated by combining final digital signals respectively determined by a plurality of digital pixels. That is, a correlated double sampling operation may be implemented through the digital signal DOUT that is generated by the operation of the comparator 112 included in the digital pixel 110 and a digital signal processing operation of the digital signal processing unit 320 included in the digital logic circuit 300.

The input/output interface 330 may be configured to receive the control information CI from an external device (e.g., an ISP or an AP) or to output the final image data IMG. In an example embodiment, the input/output interface 330 may exchange the above-described information with the external device in compliance with a given protocol. In an example embodiment, the input/output interface 330 may include a physical layer for supporting the given protocol.

Figure 8A:
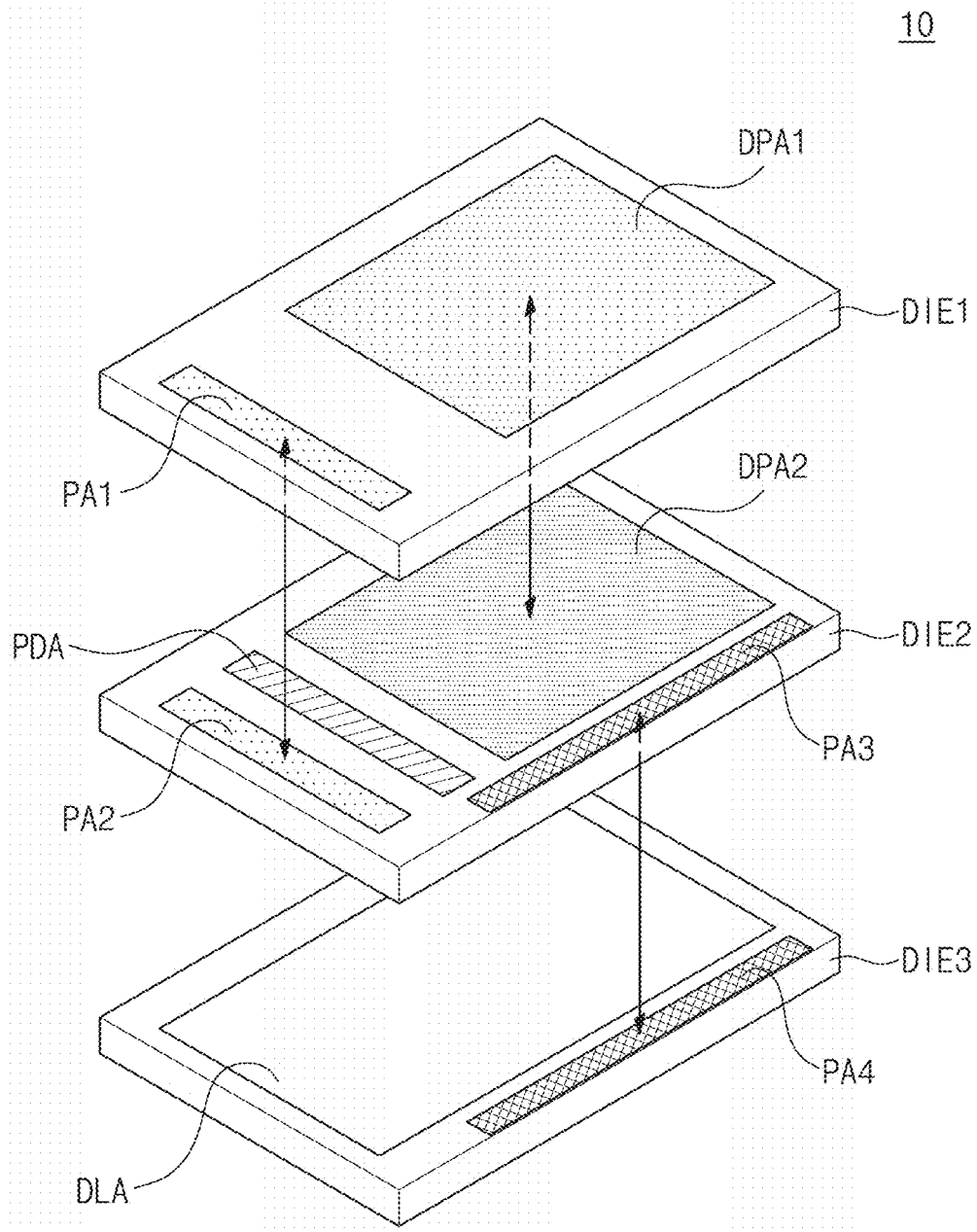
FIG. 8A is a perspective view of an image sensor device of FIG. 1.
Figure 8B:
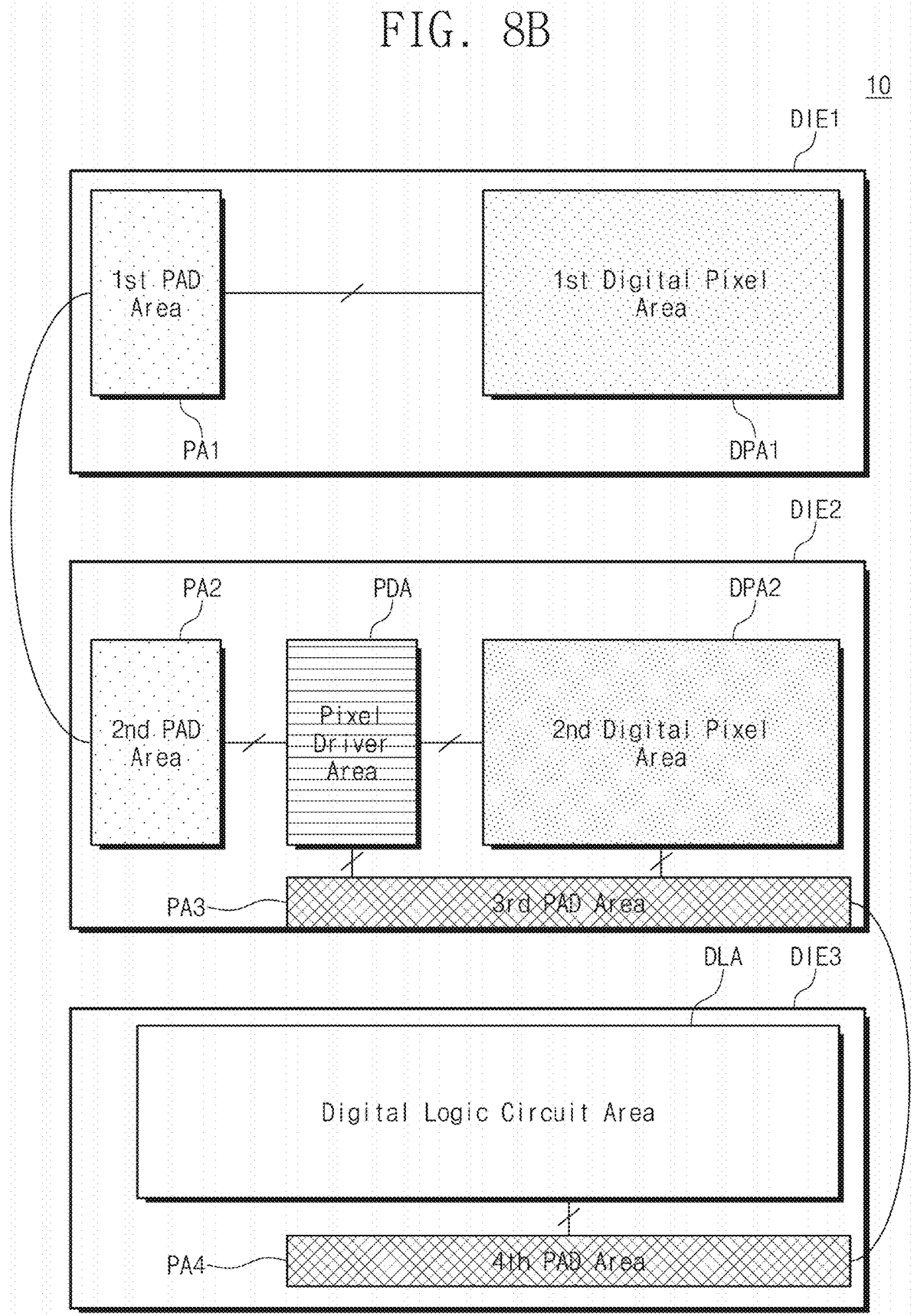
FIG. 8B is a plan view of an image sensor device of FIG. 1.

FIG. 8A is a perspective view of an image sensor device of FIG. 1, and FIG. 8B is a plan view of an image sensor device of FIG. 1. An example of the image sensor device 10 according to an example embodiment of the inventive concepts will be described with reference to FIGS. 8A and 8B in terms of a physical structure. That is, in the following drawings, example embodiments of the inventive concepts will be described with reference to semiconductor dies included in an image device. To describe example embodiments of the inventive concepts easily, components illustrated in the following drawings are simplified unlike a semiconductor wafer, a semiconductor chip, a semiconductor die, or a semiconductor package implemented in practice.

Referring to FIGS. 1, 8A, and 8B, the image sensor device 10 may include first to third semiconductor dies DIE1 to DIE3. The first to third semiconductor dies DIE1 to DIE3 may be manufactured through different semiconductor processes or from different semiconductor wafers.

The first semiconductor die DIE1 may be stacked on the second semiconductor die DIE2 and may be electrically connected with the second semiconductor die DIE2. The second semiconductor die DIE2 may be stacked on the third semiconductor die DIE3 and may be electrically connected with the third semiconductor die DIE3. In other words, the second semiconductor die DIE2 may be interposed between the first and third semiconductor dies DIE1 and DIE3.

The first semiconductor die DIE1 may include a first digital pixel area DPA1 and a first pad area PA1. The first digital pixel area DPA1 and the first pad area PA1 may be physically separated from each other or may be spaced from each other as much as a given distance.

The first digital pixel area DPA1 may be an area for a part of the plurality of digital pixels 110. For example, as described above, each of the plurality of digital pixels 110 may include a photo detector PDT, an analog-to-digital converter ADC (or the comparator 112), and the memory cells MC (or the memory circuit 113). A part of the analogto-digital converters ADC (or the comparators 112) and the photo detectors of the plurality of digital pixels 110 may be formed in the first digital pixel area DPA1 of the first semiconductor die DIE1.

The first pad area PA1 may be an area for forming a plurality of pads that are configured to be connected with the second pad area PA2 of the second semiconductor die DIE2. The first pad area PA1 may be connected with elements of the first digital pixel area DPA1 through a metal layer formed in the first semiconductor die DIE1.

The second semiconductor die DIE2 may include a second digital pixel area DPA2, the second pad area PA2, a pixel driver area PDA, and a third pad area PA3. The second digital pixel area DPA2 may include the remaining components, which are not formed in the first digital pixel area DPA1 of the first semiconductor die DIE1, from among the components of the plurality of digital pixels 110. For example, the remaining components, which are not formed in the first digital pixel area DPA1, of the analog-to-digital converter ADC (or the comparator 112) of each of the plurality of digital pixels 110 and the memory cells MC (or the memory circuit 113) of each of the plurality of digital pixels 110 may be formed in the second digital pixel area DPA2.

In an example embodiment, a portion of the comparator 112 formed in the first digital pixel area DPA1 of the first semiconductor die DIE1 and the remaining portion of the comparator 112 formed in the second digital pixel area DPA2 of the second semiconductor die DIE2 may be bonded through a connection structure formed on a plane corresponding to the first digital pixel area DPA1 or the second digital pixel area DPA2. In an example embodiment, the connection structure may be an element, which is configured to bond semiconductor dies, such as Cu-to-Cu bonding, TSV (Through Silicon Via), or BVS or a material for bonding semiconductor dies.

The pixel driver area PDA may be an area for forming the pixel driver 200 described above. Some analog circuits such as the row driver RDV, the ramp generator RAMP, the counter CNT, and the voltage generator V GER described above may be formed in the pixel driver area PDA.

The second pad area PA2 may be an area for forming a plurality of pads that are connected with the first pad area PA1. The plurality of pads of the second pad area PA2 may be respectively connected with the plurality of pads of the first pad area PA1 through a connection structure. In an example embodiment, the connection structure may be an element, which is configured to bond semiconductor dies, such as Cu-to-Cu bonding, TSV (Through Silicon Via), or BVS or a material for bonding semiconductor dies.

The third pad area PA3 may be an area for forming a plurality of pads that are connected with the third semiconductor die DIE3.

In an example embodiment, various elements included in the second digital pixel area DPA2, the second pad area PA2, the pixel driver area PDA, and the third pad area PA3 may be connected to each other through a metal layer of the second semiconductor die DIE2.

The third semiconductor die DIE3 may include a digital logic circuit area DLA and a fourth pad area PA4. The digital logic circuit area DLA may be an area for forming the digital logic circuit 300 described above. The fourth pad area PA4 may be an area for forming a plurality of pads. The plurality of pads of the fourth pad area PA4 may be respectively connected with the plurality of pads of the third pad area PA3 through a connection structure. In an example embodiment, the connection structure may be an element, which is configured to bond semiconductor dies, such as Cu-to-Cu bonding, TSV (Through Silicon Via), or BVS or a material for bonding semiconductor dies.

In an example embodiment, the first digital pixel area DPA1 of the first semiconductor die DIE1 and the second digital pixel area DPA2 of the second semiconductor die DIE2 may be disposed to overlap each other in the same plane area, and may be an area for forming a plurality of digital pixels like a pixel core area.

As a peripheral area (or a peripheral circuit area), the remaining areas of the first and second semiconductor dies DIE1 and DIE2 other than the first and second digital pixel areas DPA1 and DPA2 may be an area for forming a connection structure between semiconductor dies, a driver circuit, an analog circuit, etc. In an example embodiment, circuits or physical components that operate based on a digital signal in the image sensor device 10 may be formed in the third semiconductor die DIE3.

As described above, the image sensor device 10 according to an example embodiment of the inventive concepts may be implemented through the first to third semiconductor dies DIE1 to DIE3. In this case, the area of the pixel core area for forming a plurality of digital pixels may be reduced by separately or partially forming components of each of a plurality of digital pixels in the first and second semiconductor dies DIE1 and DIE2. Also, as digital signal-based circuits are formed in the third semiconductor die DIE3, analog-based circuits and digital-based circuits may be divided in unit of a semiconductor die and may be manufactured by using processes suitable for characteristics of respective semiconductor dies, thus improving the overall performance of an image sensor device.

Figure 9:
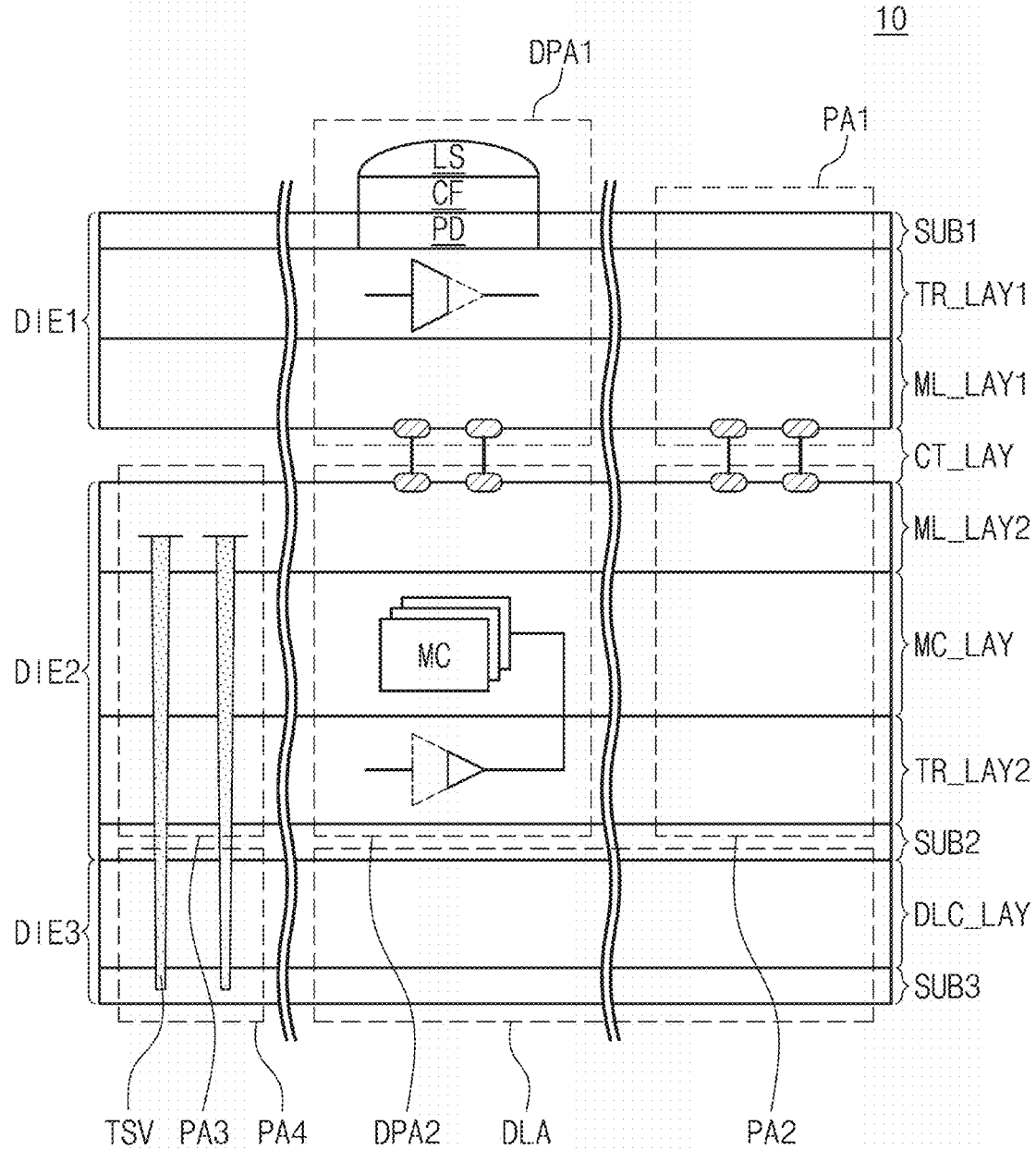
FIG. 9 is a cross-sectional view illustrating an image sensor device according to an example embodiment of FIG. 8A.

FIG. 9 is a cross-sectional view illustrating an image sensor device according to an example embodiment of FIG. 8A. Below, for brevity of illustration and for convenience of description, example embodiments of the inventive concepts will be described with reference to a structure of one digital pixel (in particular, a structure of the digital pixel 110 of FIG. 3). However, example embodiments of the inventive concepts are not limited thereto, and a digital pixel may be any one of the digital pixels 110a to 110d illustrated in FIGS. 5A to 5D or may be any one of various forms of digital pixels within a range that does not depart from the example embodiments of the inventive concepts.

Referring to FIGS. 3, 8A to 9, the image sensor device 10 may include first to third semiconductor dies DIE1 to DIE3. The first semiconductor die DIE1 may be formed in a first substrate SUB1. For example, as described above, the first semiconductor die DIE1 may include the photo detector 111 and a portion of the comparator 112 (below, referred to as a "first portion of the comparator 112"). That is, the photo diode PD may be formed in the first substrate SUB1, and a color filter CF and a lens LS may be formed on the photo diode PD.

A first transistor layer TR_LAY1 may be formed under the first substrate SUB1. For example, the transfer transistor TX and the reset transistor RX of the photo detector 111 and the first portion of the comparator 112 (i.e., a part of a plurality of transistors in the comparator 112) may be formed in the first transistor layer TR_LAY1. In an example embodiment, the first portion of the comparator 112 may include at least one of various transistors included in the comparator 112.

In an example embodiment, the photo diode PD, the color filter CF, the lens LS, the transfer transistor TX, the reset transistor RX, and the first portion of the comparator 112 may be formed in the first digital pixel area DPA1.

A first metal layer ML_LAY1 may be formed under the first transistor layer TR_LAY1. Metal lines for connecting various elements included in the first semiconductor die DIE1 may be formed in the first metal layer ML_LAY1.

The second semiconductor die DIE2 may be formed on a second substrate SUB2. For example, as described above, the second semiconductor die DIE2 may include the remaining portion (hereinafter referred to as a "second portion") of the comparator 112 other than the first portion and the memory circuit 113. That is, a second transistor layer TR_LAY2 including the second portion of the comparator 112 may be formed on the second substrate SUB2. In an example embodiment, the second portion of the comparator 112 may include transistors, which are not formed in the first semiconductor die DIE1, from among various transistors included in the comparator 112.

A memory circuit layer MC_LAY may be formed on the second transistor layer TR_LAY2. For example, the plurality of memory cells MC1 and MC2 included in the memory circuit 113 may be formed in the memory circuit layer MC_LAY.

A second metal layer ML_LAY2 may be formed on the memory circuit layer MC_LAY. Metal lines for connecting a plurality of elements included in the second semiconductor die DIE2 may be formed in the second metal layer ML_LAY2.

In an example embodiment, the first and second selection circuits SEL1 and SEL2 or the switch circuits SWa and SWb (refer to FIG. 2B) included in the memory circuit 113 may be formed in any one of the memory circuit layer MC_LAY and the second transistor layer TR_LAY2. Although not clearly illustrated in drawings, in an example embodiment, the first and second selection circuits SEL1 and SEL2 may be formed in the pixel driver area PDA of the second semiconductor die DIE2 and may be connected with the corresponding memory circuit 113 through the metal lines of the second metal layer ML_LAY2.

The plurality of memory cells MC1 and MC2 included in the memory circuit 113 may be formed in the second digital pixel area DPA2 of the memory circuit layer MC_LAY, and the second portion of the comparator 112 may be formed in the second digital pixel area DPA2 of the second transistor layer TR_LAY2.

An example is illustrated in FIG. 9 as the second transistor layer TR_LAY2 and the memory circuit layer MC_LAY of the second semiconductor die DIE2 are separated from each other, but example embodiments of the inventive concepts are not limited thereto. For example, the second portion of the comparator 112 and the memory circuit 113 may be formed in the same layer.

In an example embodiment, the photo detector 111 and the first portion of the comparator 112 formed in the first digital pixel area DPA1 of the first semiconductor die DIE1, and the second portion of the comparator 112 and the memory circuit 113 formed in the second digital pixel area DPA2 of the second semiconductor die DIE2 may constitute one digital pixel 110.

The third semiconductor die DIE3 may be formed on a third semiconductor substrate SUB3. For example, a digital logic circuit layer DLC_LAY including the digital logic circuit 300 may be formed on the third semiconductor substrate SUB3. Although not illustrated in drawings, the third semiconductor die DIE3 may further include an additional metal layer that includes a plurality of metal lines to connect a plurality of elements included in the digital logic circuit 300.

In an example embodiment, the first metal layer ML_LAY1 of the first semiconductor die DIE1 and the second metal layer ML_LAY2 of the second semiconductor die DIE2 may be bonded through a connection layer CT_LAY so as to face each other. For example, at least one first metal line included in the first metal layer ML_LAY1 of the first digital pixel area DPA1 and at least one second metal line included in the second metal layer ML_LAY2 of the second digital pixel area DPA2 may be connected to each other through a connection structure (e.g., through the Cu-to-Cu bonding).

Although not clearly illustrated in drawings, the first metal line described above may be connected with at least one element of the first portion of the comparator 112, and the second metal line described above may be connected with at least one element of the second portion of the comparator 112. That is, the first portion of the comparator 112 included in the first semiconductor die DIE1 and the second portion of the comparator 112 included in the second semiconductor die DIE2 may be connected to each other through a connection structure belonging to the first and second digital pixel areas DPA1 and DPA2.

At least one third metal line included in the first metal layer ML_LAY1 of the first pad area PA1 and at least one fourth metal line included in the second metal layer ML_LAY2 of the second pad area PA2 may be connected to each other through a connection structure (e.g., through the Cu-to-Cu bonding).

Although not clearly illustrated in drawings, the third metal line described above may be connected with at least one element of the photo detector 111, and the fourth metal line described above may be connected with at least one element of the pixel driver 200 included in the second semiconductor die DIE2.

In an example embodiment, the second semiconductor die DIE2 and the third semiconductor die DIE3 may be connected to each other through the TSV. For example, the TSV may be formed to pass through the second semiconductor die DIE2 from the second metal layer ML_LAY2 of the second semiconductor die DIE2, and the second metal layer ML_LAY2 and the third semiconductor substrate SUB3 (or a separate metal layer) of the third semiconductor die DIE3 may be connected to each other through the TSV.

As described above, the image sensor device 10 according to an example embodiment of the inventive concepts may include the first to third semiconductor dies DIE1 to DIE3. In this case, the first semiconductor die DIE1 may include a photo detector and a first portion of a comparator, the second semiconductor die DIE2 may include a pixel driver (or an analog circuit block), a second portion of the comparator, and a memory circuit, and the third semiconductor die DIE3 may include a digital logic circuit. In this case, a pixel core area in which a plurality of digital pixels are formed may be divided into at least two portions such that the divided portions are respectively formed in the first and second semiconductor dies DIE1 and DIE2, thus reducing the area of the pixel core area per semiconductor die; a digital logic circuit is formed in the separate third semiconductor die DIE3, thus preventing a noise or coupling occurring when an analog signal to a digital signal are processed in the same semiconductor die. This may mean that an image sensor device having improved performance is provided.

Figure 10:
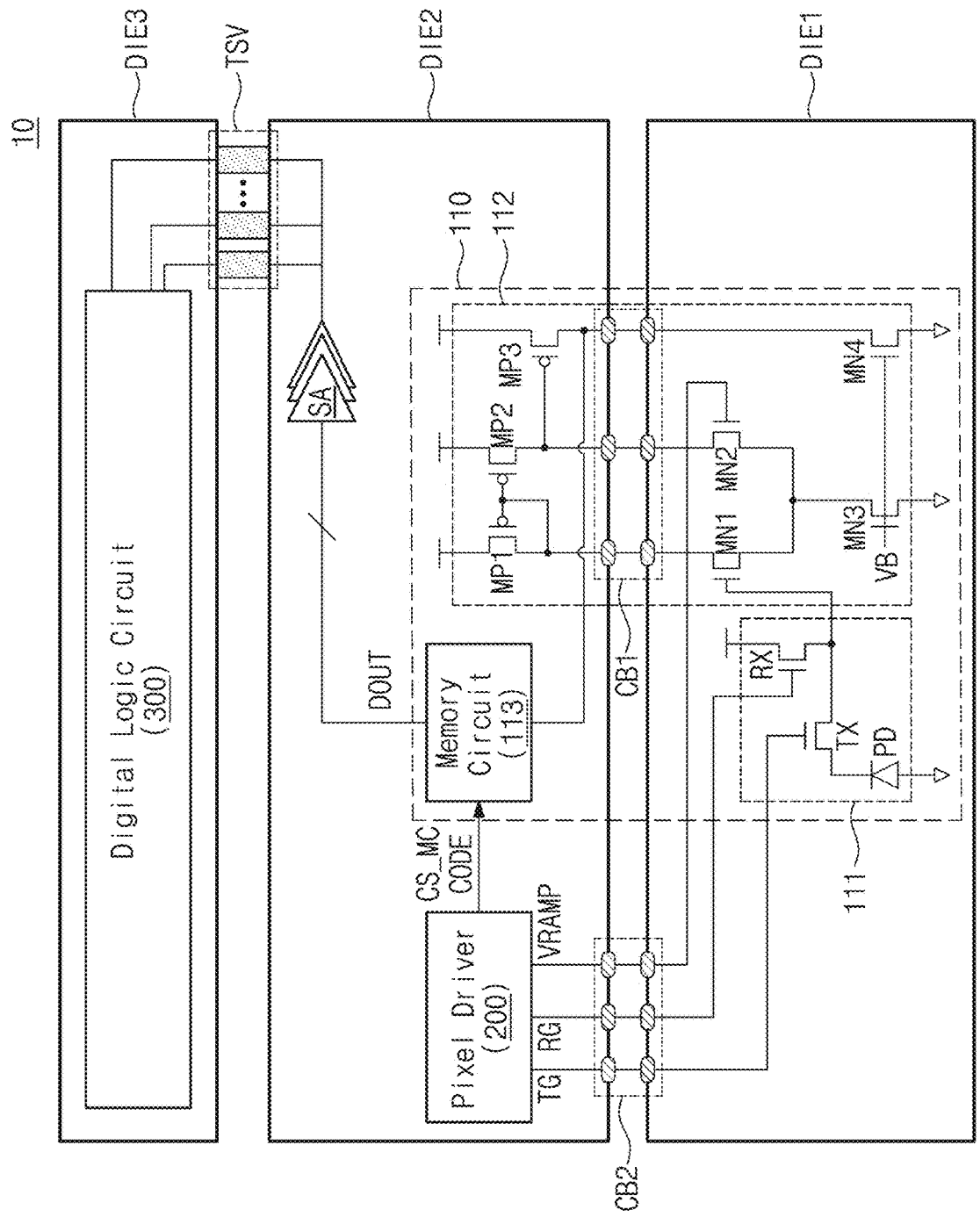
FIG. 10 is a conceptual diagram illustrating an image sensor device of FIG. 9.

FIG. 10 is a conceptual diagram illustrating an image sensor device of FIG. 9. Below, for brevity of illustration and for convenience of description, components that are unnecessary to describe example embodiments of the inventive concepts are omitted. A structure of the digital pixel 110 to be described below may be similar to the structure of the digital pixel 110 described with reference to FIG. 3. Accordingly, in the following drawings, with regard to a detailed connection relationship of elements of the digital pixel 110, additional description will be omitted to avoid redundancy.

Referring to FIGS. 8A to 10, the image sensor device 10 may include the first to third semiconductor dies DIE1 to DIE3. The first to third semiconductor dies DIE1 to DIE3 may be stacked or electrically connected as described with reference to FIGS. 8A and 8B.

The first semiconductor die DIE1 may include the photo detector 111 and the first portion of the comparator 112. For example, the photo detector 111 may include the photo diode PD, the transfer transistor TX, and the reset transistor RX, and the first portion of the comparator 112 may include the first to fourth NMOS transistors MN1 to MN4. In an example embodiment, the transfer transistor TX, the reset transistor RX, and the first to fourth NMOS transistors MN1 to MN4 may be formed in the first transistor layer TR_LAY1 of the first semiconductor die DIE1 and may be connected to each other through the metal lines included in the first metal layer ML_LAY1.

The second semiconductor die DIE2 may include the second portion of the comparator 112, the memory circuit 113, and the pixel driver 200. For example, the second portion of the comparator 112 may include first to third PMOS transistors MP1 to MP3. In an example embodiment, the second portion of the comparator 112 may be formed in the second transistor layer TR_LAY2 of the second semiconductor die DIE2, the memory circuit 113 may be formed in the memory circuit layer MC_LAY of the second semiconductor die DIE2, and the pixel driver 200 may be formed in the pixel driver area PDA of the second semiconductor die DIE2. Various elements included in the second semiconductor die DIE2 may be connected to each other through metal lines included in the second metal layer ML_LAY2.

In an example embodiment, the first portion of the comparator 112 may include all NMOS transistors among of transistors included in the comparator 112, and the second portion of the comparator 112 may include all PMOS transistors of the transistors included in the comparator 112. However, example embodiments of the inventive concepts are not limited thereto.

In an example embodiment, the first portion and the second portion of the comparator 112 may be connected to each other through a first connection structure CB1. The first connection structure CB1 may be interposed between the first and second digital pixel areas DPA1 and DPA2 of the first and second semiconductor dies DIE1 and DIE2 (or an area in which the first and second digital pixel areas DPA1 and DPA2 overlap each other). For example, the connection between the first PMOS transistor MP1 and the first NMOS transistor MN1, the connection between the second PMOS transistor MP2 and the second NMOS transistor MN2, and the connection between the third PMOS transistor MP3 and the fourth NMOS transistor MN4 may be made through the first connection structure CB1. In an example embodiment, the first connection structure CB1 may be the Cu-to-Cu bondings formed between the first and second semiconductor dies DIE1 and DIE2.

In an example embodiment, the photo detector 111 and the first portion of the comparator 112 of the first semiconductor die DIE1, and the second portion of the comparator 112 and the memory circuit 113 of the second semiconductor die DIE2 may constitute one digital pixel 110. That is, as the first portion of the comparator 112 included in the one digital pixel 110 is formed in the first semiconductor die DIE1 and the second portion of the comparator 112 is formed in the second semiconductor die DIE2, the area of the pixel core area for forming digital pixels may be reduced.

As described above, the pixel driver 200 may be configured to output the photo detector control signal CS_PD, such as the transfer signal TG and the reset signal RG, the memory control signal CS_MC, the code "CODE", and the ramp signal VRAMP.

In an example embodiment, as described above, the pixel driver 200 may be included in the second semiconductor die DIE2. In this case, the photo detector control signal CS_PD (e.g., TG and RG) for controlling the photo detector 111 may be provided to the photo detector 111 of the first semiconductor die DIE1 through a second connection structure CB2. In an example embodiment, the second connection structure CB2 may be the Cu-to-Cu bondings formed between the first and second semiconductor dies DIE1 and DIE2.

The pixel driver 200 included in the second semiconductor die DIE2 may output the ramp signal VRAMP for a comparison operation of the comparator 112. In this case, the ramp signal VRAMP from the pixel driver 200 may be provided to the first portion (in particular, a gate of the second NMOS transistor MN2) of the comparator 112 through the second connection structure CB2.

As described above, the memory circuit 113 may be configured to output the digital signal DOUT in response to an output signal (i.e., the comparison signal CMP_OUT) from the comparator 112, the memory control signal CS_MC, and the code "CODE".

The digital signal DOUT may be amplified through a plurality of sense amplifiers SA included in the second semiconductor die DIE2, and the amplified digital signal may be provided to the digital logic circuit 300 of the third semiconductor die DIE3 through TSV.

As described above, the digital logic circuit 300 may perform a digital signal processing operation on the received digital signal DOUT to output a final image signal.

Although not clearly illustrated in drawings, the digital logic circuit 300 included in the third semiconductor die DIE3 may provide the control information CI for controlling the pixel driver 200 through a separate TSV.

Figure 11:
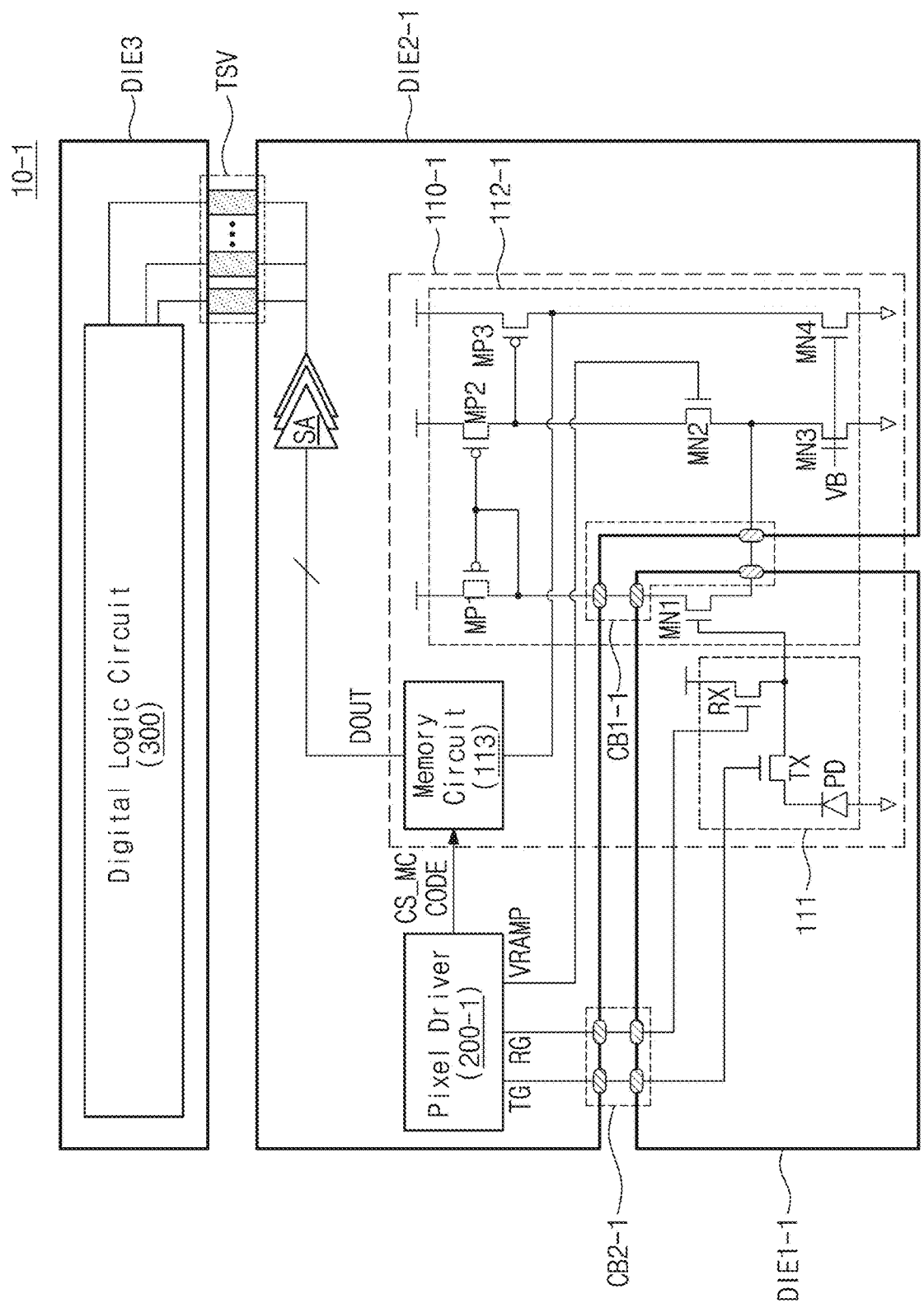
FIG. 11 is a conceptual diagram illustrating an image sensor device of FIG. 9.

FIG. 11 is a conceptual diagram illustrating an image sensor device of FIG. 9. For brevity of illustration and for convenience of description, with regard to the same components, additional description will be omitted to avoid redundancy.

Referring to FIG. 11, an image sensor device 10 may include a first semiconductor die DIE1-1, a second semiconductor die DIE2-1, and the third semiconductor die DIE3. As in the above description, the first semiconductor die DIE1-1 may include the photo detector 111 and a first portion of a comparator 112-1, the second semiconductor die DIE2-1 may include a second portion of the comparator 112-1, the memory circuit 113, a pixel driver 200-1, and the plurality of sense amplifiers SA, and the third semiconductor die DIE3 may include the digital logic circuit 300.

As in the above description, the first and second semiconductor dies DIE1-1 and DIE2-1 may be connected to each other through connection structures CB1-1 and CB2-1, and the second and third semiconductor dies DIE2-1 and DIE3 may be connected to each other through the TSV. As in the above description, the photo detector 111 and the first portion of the comparator 112-1 of the first semiconductor die DIE1-1, and the second portion of the comparator 112-1 and the memory circuit 113 of the second semiconductor die DIE2-1 may constitute one digital pixel 110-1.

In an example embodiment, unlike the embodiment of FIG. 10, in the embodiment of FIG. 11, the first portion of the comparator 112-1 may include the first NMOS transistor MN1, and the second portion of the comparator 112-1 may include the remaining transistors (e.g., MP1, MP2, MP3, MN2, MN3, and MN4) of the comparator 112-1. That is, the first NMOS transistor MN1 of the comparator 112-1 may be formed in the first semiconductor die DIE1-1, and the remaining transistors (e.g., MP1, MP2, MP3, MN2, MN3, and MN4) of the comparator 112-1 may be formed in the second semiconductor die DIE2-1.

The first NMOS transistor MN1 formed in the first semiconductor die DIE1-1 may be connected between the first PMOS transistor MP1 and the third NMOS transistor MN3 of the second semiconductor die DIE2-1 through the connection structure CB1-1.

As in the above description, the photo detector control signal CS_PD, which is generated from the pixel driver 200-1, such as the transfer signal TG and the reset signal RG may be provided to the photo detector 111 of the first semiconductor die DIE1-1 through the connection structure CB2-1. In contrast, because the second NMOS transistor MN2 receiving the ramp signal VRAMP is formed in the second semiconductor die DIE2-1 in which the pixel driver 200-1 is formed, the ramp signal VRAMP generated from the pixel driver 200-1 may be provided directly to the comparator 112-1 (in particular, a gate of the second NMOS transistor MN2) through a metal line formed in the second metal layer ML_LAY2 of the second semiconductor die DIE2-1.

The remaining components are similarly described above, and thus, additional description will be omitted to avoid redundancy.

Figure 12:
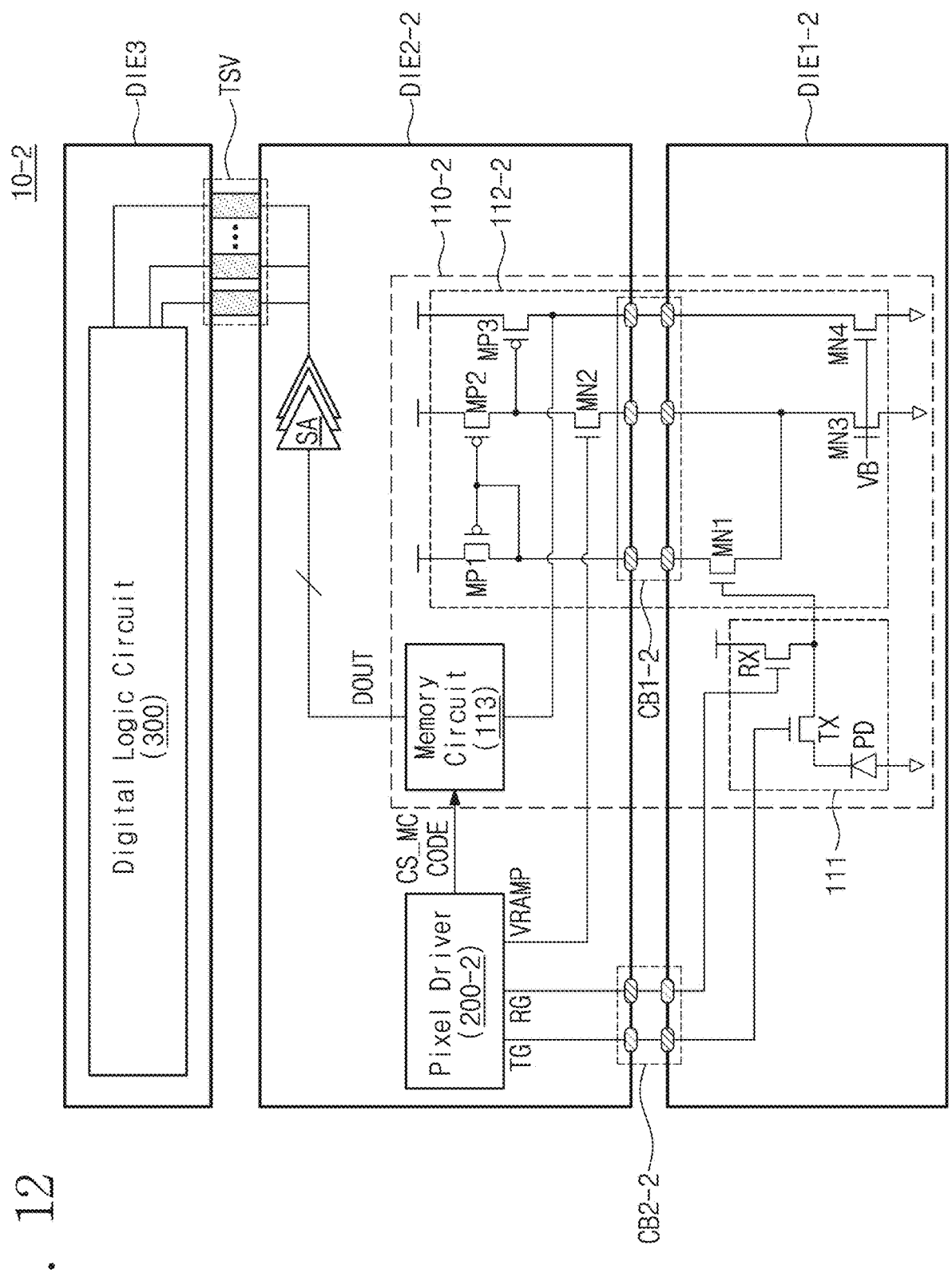
FIG. 12 is a conceptual diagram illustrating an image sensor device of FIG. 9.

FIG. 12 is a conceptual diagram illustrating an image sensor device of FIG. 9. As in the above description, with regard to the same components, additional description will be omitted to avoid redundancy. Referring to FIG. 12, an image sensor device 10-2 may include a first semiconductor die DIE1-2, a second semiconductor die DIE2-2, and the third semiconductor die DIE3.

As in the above description, the first semiconductor die DIE1-2 may include the photo detector 111 and a first portion of a comparator 112-2, and the second semiconductor die DIE2-2 may include a second portion of the comparator 112-2, the memory circuit 113, a pixel driver 200-2. The third semiconductor die DIE3 may include the digital logic circuit 300. The first portion and the second portion of the comparator 112-2 may be electrically connected to each other through a first connection structure CB1-2 between the first and second semiconductor dies DIE1-2 and DIE2-2. The photo detector 111 and the first portion of the comparator 112-2 of the first semiconductor die DIE1-1, and the second portion of the comparator 112-2 and the memory circuit 113 of the second semiconductor die DIE2-2 may constitute one digital pixel 110-2.

In an example embodiment, unlike the embodiment of FIG. 11, in the embodiment of FIG. 12, the first portion of the comparator 112-2 may include the first, third, and fourth NMOS transistors MN1, MN3, and MN4, and the second portion of the comparator 112-2 may include the second NMOS transistor MN2 and the first to third PMOS transistors MP1 to MP3. The first portion and the second portion of the comparator 112-2 may be connected to each other through the first connection structure CB1-2. For example, the first PMOS transistor MP1, the second NMOS transistor MN2, and the third PMOS transistor MP3 may be respectively connected with the first NMOS transistor MN1, the third NMOS transistor MN3, and the fourth NMOS transistor MN4 through the first connection structure CB1-2.

That is, the transfer signal TG and the reset signal RG from the pixel driver 200-2 may be provided to the photo detector 111 of the first semiconductor die DIE1-2 through a second connection structure CB2-2, and the ramp signal VRAMP may be provided directly to the second portion (in particular, a gate of the second NMOS transistor MN2) of the comparator 112-2 through the second metal layer ML_LAY2 formed in the second semiconductor die DIE2-2. The remaining components are similarly described with reference to FIG. 10 or 11, and thus, additional description will be omitted to avoid redundancy.

Figure 13:
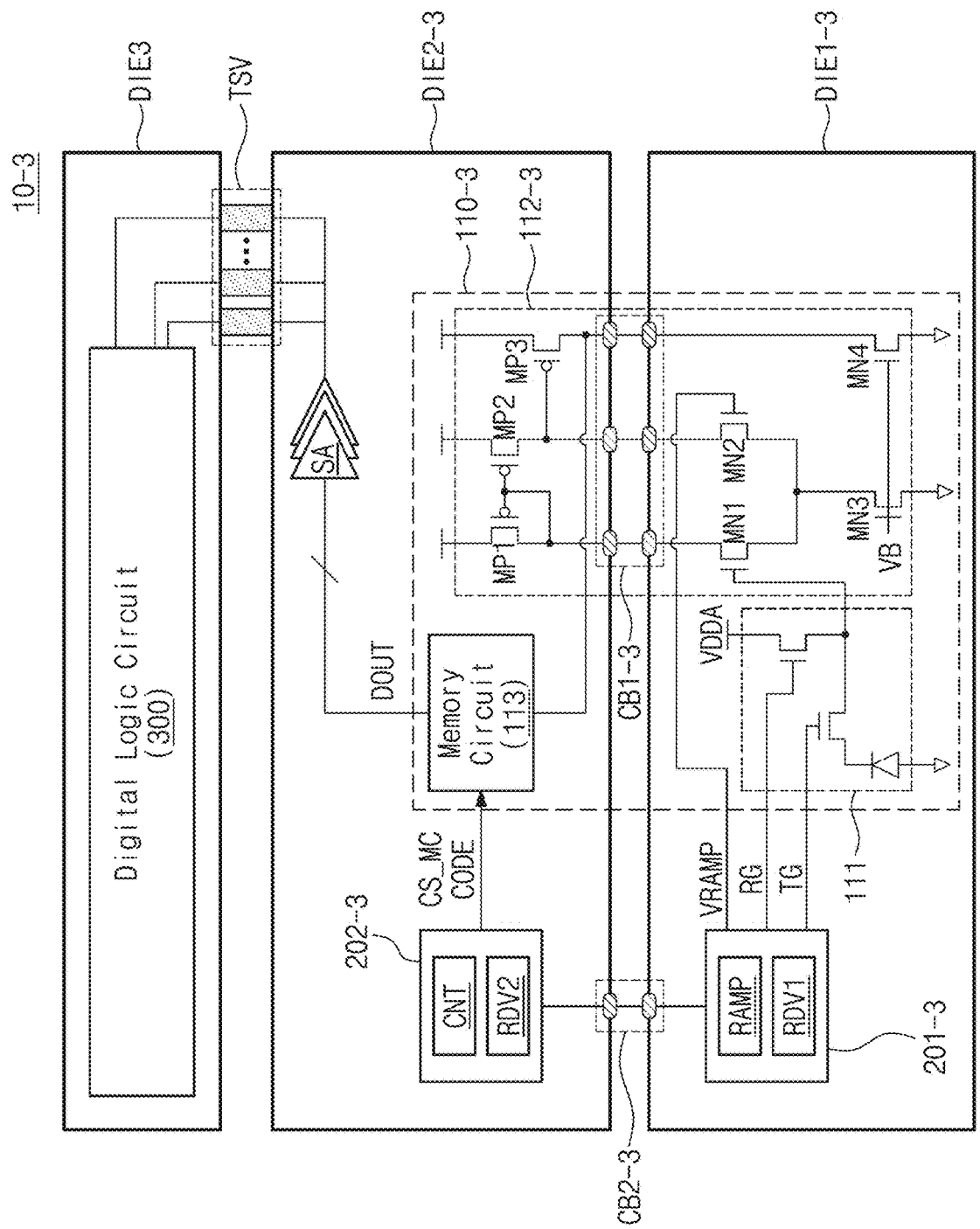
FIG. 13 is a conceptual diagram illustrating an image sensor device of FIG. 9.

FIG. 13 is a conceptual diagram illustrating an image sensor device of FIG. 9. As in the above description, with regard to the same components, additional description will be omitted to avoid redundancy. Referring to FIG. 13, an image sensor device 10-3 may include a first semiconductor die DIE1-3, a second semiconductor die DIE2-3, and the third semiconductor die DIE3.

The first semiconductor die DIE1-3 may include the photo detector 111, a first portion of a comparator 112-3, and a first pixel driver 201-3, the second semiconductor die DIE2-3 may include a second portion of the comparator 112-3, the memory circuit 113, a second pixel driver 202-3, and the third semiconductor die DIE3 may include the digital logic circuit 300. The first portion and the second portion of the comparator 112-3 may be connected to each other through a first connection structure CB1-3. The photo detector 111 and the first portion of the comparator 112-3 of the first semiconductor die DIE1-3, and the second portion of the comparator 112-3 and the memory circuit 113 of the second semiconductor die DIE2-3 may constitute one digital pixel 110-3. A configuration of the digital pixel 110-3 of FIG. 13 is similar to the configuration of the digital pixel 110 of FIG. 10, and thus, additional description will be omitted to avoid redundancy.

The first pixel driver 201-3 may generate control signals (e.g., RG, TG, and VRAMP) for controlling elements included in the first semiconductor die DIE1-3. For example, the first pixel driver 201-3 may be formed in an area of the first semiconductor die DIE1-3 other than the first digital pixel area DPA1 (refer to FIG. 8) (or in a peripheral area of the first semiconductor die DIE1-3).

The first pixel driver 201-3 may include a first row driver RDV1 and the ramp generator RAMP. The first row driver RDV1 may be configured to output the transfer signal TG and the reset signal RG for controlling the photo detector 111 included in the first semiconductor die DIE1-3. The ramp generator RAMP may be configured to generate the ramp signal VRAMP input to the first portion (in particular, a gate of the second NMOS transistor MN2) of the comparator 112-3.

In other words, various signals that are used in the photo detector 111 and the first portion of the comparator 112-3 included in the first semiconductor die DIE1-3 may be provided directly to components from the first pixel driver 201-3 through metal lines of the first metal layer ML_LAY1.

The second pixel driver 202-3 included in the second semiconductor die DIE2-3 may be configured to generate control signals (e.g., CS_MC and CODE) for controlling elements included in the second semiconductor die DIE2-3. For example, the second pixel driver 202-3 may include the counter CNT configured to generate the code "CODE" and a second row driver RDV2 configured to control the memory circuit 113. The second row driver RDV2 may provide the memory control signal CS_MC for controlling the memory circuit 113 to the memory circuit 113 through metal lines of the second metal layer ML_LAY2 (refer to FIG. 9).

As described above, the first semiconductor die DIE1-3 may generate various signals used in components included in the first semiconductor die DIE1-3 and may provide various signals directly to the components through a metal layer formed in the first semiconductor die DIE1-3; the second semiconductor die DIE2-3 may generate various signals used in components included in the second semiconductor die DIE2-3 and may provide various signals directly to the components through a metal layer formed in the second semiconductor die DIE2-3.

In an example embodiment, the first pixel driver 201-3 of the first semiconductor die DIE1-3 and the second pixel driver 202-3 of the second semiconductor die DIE2-3 may be connected through a connection structure CB2-3. The first and second pixel drivers 201-3 and 202-3 may operate together in synchronization with a signal provided through the connection structure CB2-3. For example, the first row driver RDV1 and the second row driver RDV2 may operate in synchronization with a desired (or, alternatively, a predefined) timing. In this case, the first row driver RDV1 and the second row driver RDV2 may exchange mutually synchronized signals with each other through the connection structure CB2-3.

Figure 14:
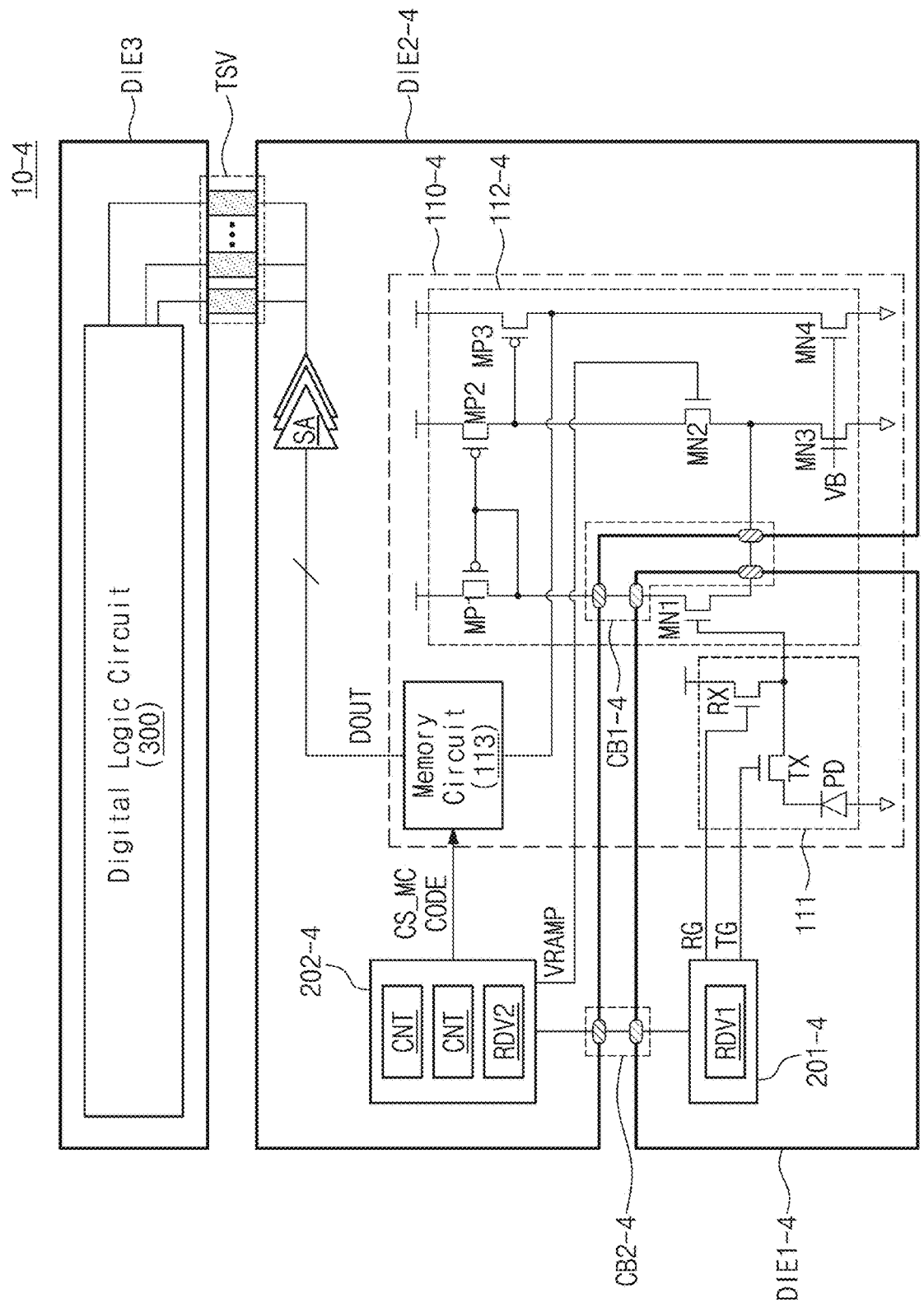
FIG. 14 is a conceptual diagram illustrating an image sensor device of FIG. 9.

FIG. 14 is a conceptual diagram illustrating an image sensor device of FIG. 9. Referring to FIG. 14, an image sensor device 10-4 may include a first semiconductor die DIE1-4, a second semiconductor die DIE2-4, and the third semiconductor die DIE3.

The first semiconductor die DIE1-4 may include the photo detector 111, a first portion of a comparator 112-4, and a first pixel driver 201-4. The second semiconductor die DIE2-4 may include a second portion of the comparator 112-4, the memory circuit 113, a second pixel driver 202-4, and the plurality of sense amplifiers SA. The third semiconductor die DIE3 may include the digital logic circuit 300. The first portion and the second portion of the comparator 112-4 may be connected to each other through a first connection structure CB1-4. The first portion and the second portion of the comparator 112-4 are similar to those described with reference to FIG. 11, and thus, additional description will be omitted to avoid redundancy. As in the above description, the photo detector 111 and the first portion of the comparator 112-4 of the first semiconductor die DIE1-4, and the second portion of the comparator 112-4 and the memory circuit 113 of the second semiconductor die DIE2-4 may constitute one digital pixel 110-4.

A first pixel driver 201-4 of the first semiconductor die DIE1-4 may be configured to drive elements included in the first semiconductor die DIE1-4, and a second pixel driver 202-4 of the second semiconductor die DIE2-4 may be configured to drive elements included in the second semiconductor die DIE2-4.

For example, the first pixel driver 201-4 may generate the transfer signal TG and the reset signal RG for controlling the photo detector 111 included in the first semiconductor die DIE1-4. In an example embodiment, the transfer signal TG and the reset signal RG may be generated by the first row driver RDV1. In an example embodiment, the transfer signal TG and the reset signal RG may be provided directly to corresponding elements from the first pixel driver 201-4 through metal lines of the first metal layer ML_LAY1 (refer to FIG. 9).

The second pixel driver 202-4 may generate the memory control signal CS_MC, the code "CODE", and the ramp signal VRAMP for controlling the memory circuit 113 and the second portion of the comparator 112-4 included in the second semiconductor die DIE2-4. The memory control signal CS_MC may be generated by the second row driver RDV2, the code "CODE" may be generated by the counter CNT, and the ramp signal VRAMP may be generated by the ramp generator RAMP. In an example embodiment, the memory control signal CS_MC, the code "CODE", and the ramp signal VRAMP may be provided directly to corresponding elements from the second pixel driver 202-4 through metal lines of the second metal layer ML_LAY2 (refer to FIG. 9).

In an example embodiment, as described with reference to FIG. 13 the first and second pixel drivers 201-4 and 202-4 may exchange mutually synchronized signals through a connection structure CB2-4.

Figure 15:
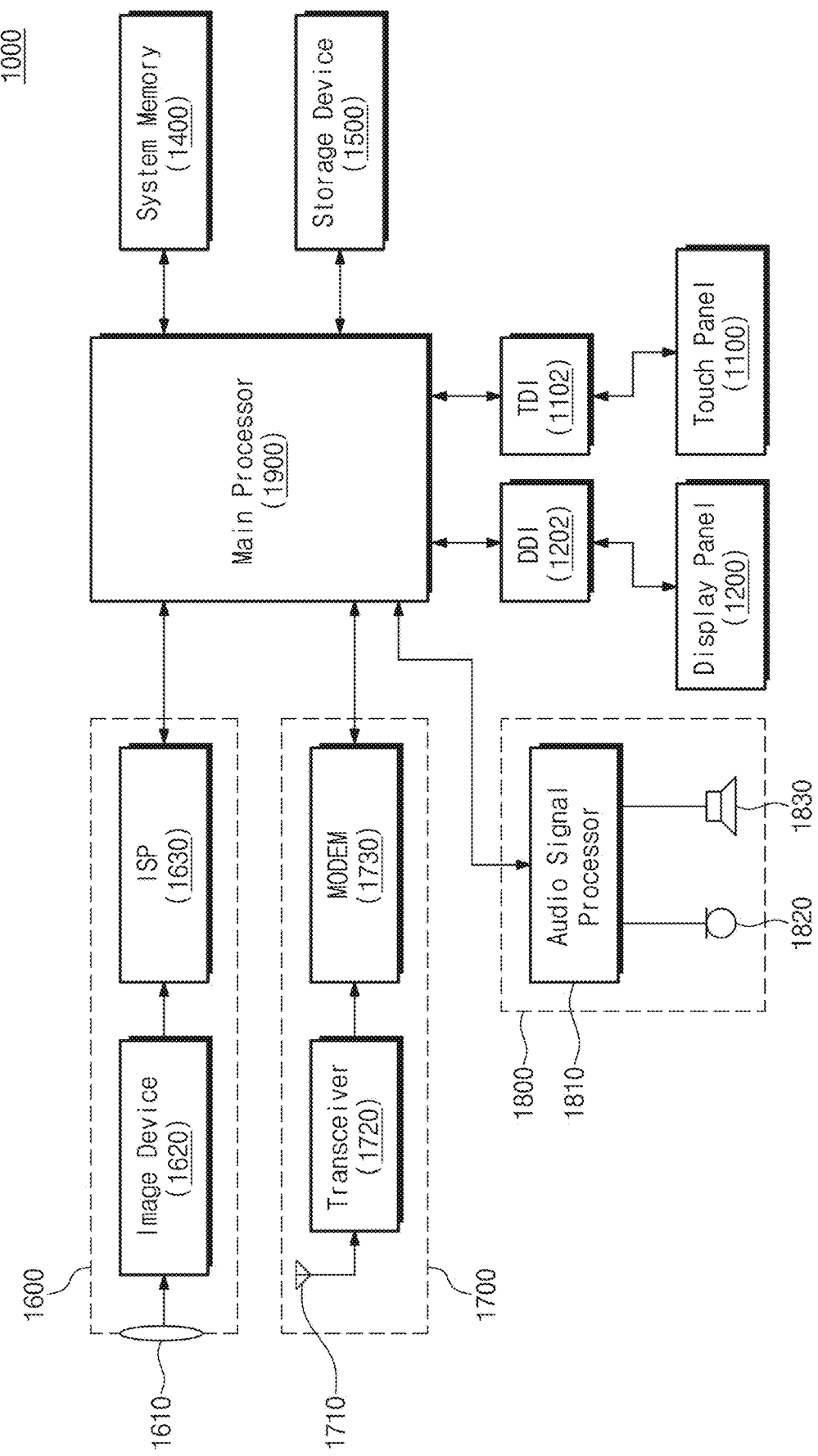
FIG. 15 is a block diagram illustrating an electronic device to which an image signal processor according to an example embodiment of the inventive concepts is applied.

FIG. 15 is a block diagram illustrating an electronic device to which an image signal processor according to example embodiments of the inventive concepts is applied. Referring to FIG. 15, an electronic device 1000 may include a touch panel 1100, a touch driver integrated circuit 1102, a display panel 1200, a display driver integrated circuit 1202, a system memory 1400, a storage device 1500, an image processor 1600, a communication block 1700, an audio processor 1800, and a main processor 1900. For example, the electronic device 1000 may be one of various electronic devices such as a portable communication terminal, a personal digital assistant (PDA), a portable media player (PMP), a digital camera, a smartphone, a tablet computer, a laptop computer, and a wearable device.

The touch driver integrated circuit 1102 may be configured to control the touch panel 1100. The touch panel 1100 may be configured to sense a touch input from a user under control of the touch driver integrated circuit 1102. The display driver integrated circuit 1202 may be configured to control the display panel 1200. The display panel 1200 may be configured to display image information under control of the display driver integrated circuit 1202.

The system memory 1400 may store data that are used for an operation of the electronic device 1000. For example, the system memory 1400 may temporarily store data processed or to be processed by the main processor 1900. For example, the system memory 1400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM). In an example embodiment, output data output from an image signal processor 1630 may be stored in the system memory 1400.

The storage device 1500 may store data regardless of whether a power is supplied. For example, the storage device 1500 may include at least one of various nonvolatile memories such as a flash memory, a PRAM, an MRAM, a ReRAM, and a FRAM. For example, the storage device 1500 may include an embedded memory and/or a removable memory of the electronic device 1000.

The image processor 1600 may receive light through a lens 1610. An image device 1620 and the image signal processor 1630 included in the image processor 1600 may generate image information about an external object, based on a received light. In an example embodiment, the image signal processor 1630 may be an image sensor device described with reference to FIGS. 1 to 11 or may operate based on the method described with reference to FIGS. 1 to 11.

The communication block 1700 may exchange signals with an external device/system through an antenna 1710. A transceiver 1720 and a modulator/demodulator (MODEM) 1730 of the communication block 1700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The audio processor 1800 may process an audio signal by using an audio signal processor 1810. The audio processor 1800 may receive an audio input through a microphone 1820 or may provide an audio output through a speaker 1830.

The main processor 1900 may control overall operations of the electronic device 1000. The main processor 1900 may control/manage operations of components of the electronic device 1000. The main processor 1900 may process various operations for the purpose of operating the electronic device 1000. In an example embodiment, a part of the components of FIG. 12 may be implemented in the form of a system on chip and may be provided as an application processor (AP) of the electronic device 1000.

As described above, an image sensor device according to an example embodiment of the inventive concepts may include a plurality of digital pixels configured to output a digital signal in the unit of a pixel. In this case, the image sensor device may be composed of a plurality of semiconductor dies. At least a portion of each of the plurality of digital pixels may be formed in a first semiconductor die of the plurality of semiconductor dies. The remaining portion of each of the plurality of digital pixels may be formed in a second semiconductor die of the plurality of semiconductor dies. Control circuits (e.g., a pixel driver or analog circuits) for controlling the respective digital pixels may be formed in the second semiconductor die or may be divided into at least two portions such that the divided portions are respectively formed in the first and second semiconductor dies. A digital logic circuit that performs a digital signal processing operation on a digital signal from each of the plurality of digital pixels may be formed in a third semiconductor die of the plurality of semiconductor dies. The plurality of semiconductor dies may be bonded to each other based various manners (e.g., Cu-to-Cu bonding, TSV, and BVS). Thereby, the area of a pixel core area for forming a plurality of digital pixels on a semiconductor die or a semiconductor substrate may be reduced. Also, as an analog circuit and a digital circuit are formed in different semiconductor dies, components to process an analog signal and a digital signal may be separated, and thus, the overall performance and reliability of the image sensor device may be improved.

According to an example embodiment of the inventive concepts, a portion of a digital pixel is formed in a first semiconductor die, the remaining portion of the digital pixel is formed in a second semiconductor die, and a digital logic circuit to perform digital signal processing on a digital signal from the digital pixel is formed in a third semiconductor die. Accordingly, the area of an image sensor device may be reduced, and the performance and reliability of the image sensor device is improved as an analog circuit and a digital circuit are independently formed in separate semiconductor dies.

According to one or more example embodiments, the units and/or devices described above including elements of the digital pixel 110, the pixel driver 200, and the digital logic circuit 300 including sub-components thereof may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments of the inventive concepts has been described with reference to some example embodiments thereof, it will be apparent to those of ordinary skill in the art that various changes and modifications may be made thereto without departing from the spirit and scope of example embodiments of the inventive concepts as set forth in the following claims.

What is claimed is:

1. An image sensor device comprising:
   a digital pixel including a photo detector, a comparator, and a memory circuit;
   a pixel driver configured to control the digital pixel; and
   a digital logic circuit configured to perform a digital signal processing operation on a digital signal output from the digital pixel, wherein
      the photo detector and a first portion of the comparator are formed in a first semiconductor die,
      a second portion of the comparator, the memory circuit including a plurality of random access memory cells, and the pixel driver are formed in a second semiconductor die under the first semiconductor die, and
      the digital logic circuit is formed in a third semiconductor die under the second semiconductor die.

2. The image sensor device of claim 1, wherein the pixel driver comprises:
   a row driver configured to generate a photo detector control signal to control the photo detector and a memory control signal to control the memory circuit;
   a ramp generator configured to generate a ramp signal provided to the comparator; and
   a counter configured to generate a code provided to the memory circuit.

3. The image sensor device of claim 2, wherein
   the photo detector is configured to convert a sensed light signal to a detection signal in response to the photo detector control signal,
   the comparator is configured to,
      receive the detection signal through a first input node,
      receive the ramp signal through a second input node, and
      generate a comparison signal based on the detection signal and the ramp signal, and
   in response to the memory control signal and the comparison signal, the memory circuit is configured to store the code as a stored code and to output the stored code as the digital signal.

4. The image sensor device of claim 2, wherein
   connection structures interposed between the first semiconductor die and the second semiconductor die are configured to provide the photo detector control signal from the row driver to the photo detector, and
   a metal layer formed in the second semiconductor die is configured to directly provide the code, the ramp signal, and the memory control signal to the memory circuit.

5. The image sensor device of claim 2, wherein
   connection structures interposed between the first semiconductor die and the second semiconductor die are configured to provide the photo detector control signal and the ramp signal from the row driver to the photo detector and the first portion of the comparator, respectively, and
   a metal layer formed in the second semiconductor die is configured to directly provide the code and the memory control signal to the memory circuit.

6. The image sensor device of claim 1, wherein
   the photo detector and the first portion of the comparator are formed in a first area of the first semiconductor die,
   the second portion of the comparator and the memory circuit are formed in a second area of the second semiconductor die, the first area of the first semiconductor die overlapping the second area of the second semiconductor die on a same plane, and wherein
      the first portion of the comparator and the second portion of the comparator are electrically connected to each other through first connection structures, the first connection structures being between the first semiconductor die and the second semiconductor die in an area where the first area of the first semiconductor die overlaps the second area of the second semiconductor die.

7. The image sensor device of claim 6, wherein
   second connection structures interposed between the first and second semiconductor dies are configured to electrically connect the pixel driver with the photo detector, wherein the second connection structures are positioned in a third area that does not overlap the first area of the first semiconductor die and the second area of the second semiconductor die.

8. The image sensor device of claim 7, further comprising:
sense amplifiers configured to amplify the digital signal output from the memory circuit, the sense amplifiers being formed in the second semiconductor die, wherein third connection structures interposed between the second semiconductor die and the third semiconductor die is configured to provide the digital signal amplified from the sense amplifiers to the digital logic circuit, the third connection structures being positioned in a fourth area that does not overlap the first area of the first semiconductor die and the second area of the second semiconductor die.

9. The image sensor device of claim 1, wherein the comparator includes:
a first PMOS transistor connected between a power supply voltage terminal and a first node, the first PMOS transistor configured to operate in response to a level of the first node;
a second PMOS transistor connected between the power supply voltage terminal and a second node, the second PMOS transistor configured to operate in response to the level of the first node;
a third PMOS transistor connected between the power supply voltage terminal and an output node of the comparator, the third PMOS transistor configured to operate in response to a level of the second node;
a first NMOS transistor connected between the first node and a third node, the first NMOS transistor configured to operate in response to a level of a first input node of the comparator;
a second NMOS transistor connected between the second node and the third node, the second NMOS transistor configured to operate in response to a level of a second input node of the comparator;
a third NMOS transistor connected between the third node and a ground voltage terminal, the third NMOS transistor configured to operate in response to a bias voltage; and
a fourth NMOS transistor connected between the output node and the ground voltage terminal, the fourth NMOS transistor configured to operate in response to the bias voltage.

10. The image sensor device of claim 9, wherein
the first portion of the comparator formed in the first semiconductor die includes the first NMOS transistor, the second NMOS transistor, the third NMOS transistor and the fourth NMOS transistor, and
the second portion of the comparator formed in the second semiconductor die includes the first PMOS transistor, the second PMOS transistor and the third PMOS transistor.

11. The image sensor device of claim 1, wherein the plurality of random access memory cells formed in the second semiconductor die includes dynamic random access memory (DRAM) cells formed in the second semiconductor die.

12. An image sensor device comprising:
a digital pixel including a photo detector, a comparator, and a memory circuit;
a pixel driver configured to control the digital pixel; and
a digital logic circuit configured to perform a digital signal processing operation on a digital signal output from the digital pixel, wherein the photo detector, a first portion of the comparator, and a first portion of the pixel driver are formed in a first semiconductor die,
a second portion of the comparator, the memory circuit including a plurality of random access memory cells, and a second portion of the pixel driver are formed in a second semiconductor die under the first semiconductor die, and
the digital logic circuit is formed in a third semiconductor die under the second semiconductor die.

13. The image sensor device of claim 12, wherein the pixel driver includes:
a first row driver configured to generate a photo detector control signal to control the photo detector;
a second row driver configured to generate a memory control signal to control the memory circuit;
a ramp generator configured to generate a ramp signal provided to the comparator; and
a counter configured to generate a code provided to the memory circuit.

14. The image sensor device of claim 13, wherein
the first portion of the pixel driver includes the first row driver and the ramp generator, a first metal layer formed in the first semiconductor die configured to directly provide the photo detector control signal from the first row driver and the ramp signal from the ramp generator to the photo detector and the first portion of the comparator, respectively, and
the second portion of the pixel driver includes the second row driver and the counter, a second metal layer formed in the second semiconductor die configured to directly provide the memory control signal from the second row driver and the code from the counter to the memory circuit.

15. The image sensor device of claim 13, wherein the plurality of random access memory cells are configured to store the code in response to the memory control signal and an output signal of the comparator.

16. The image sensor device of claim 15, further comprising:
a plurality of sense amplifiers configured to receive the code stored in the plurality of random access memory cells, and to amplify the code to output the digital signal, wherein
connection structures between the second and third semiconductor dies are configured to connect the plurality of sense amplifiers with the digital logic circuit.

17. An image sensor device comprising:
a first semiconductor die including a first portion of a digital pixel;
a second semiconductor die disposed under the first semiconductor die, the second semiconductor die including a second portion of the digital pixel, the second portion of the digital pixel including at least a memory circuit having a plurality of random access memory cells configured to store a code based on a comparison signal;
first connection structures configured to connect the second portion of the digital pixel with the first portion of the digital pixel;
a third semiconductor die disposed under the second semiconductor die, the third semiconductor die including a digital logic circuit, the digital logic circuit configured to receive a digital signal from the second portion of the digital pixel; and second connection structures configured to connect the digital logic circuit with the second portion of the digital pixel.

18. The image sensor device of claim 17, wherein the digital pixel further comprises:
 a photo detector configured to convert a light signal sensed from outside into a detection signal; and
 a comparator configured to compare the detection signal and a ramp signal to output the comparison signal, wherein
  the first portion of the digital pixel associated with the first semiconductor die includes at least a portion of the comparator and the photo detector, and
  the second portion of the digital pixel associated with the second semiconductor die includes a remaining portion of the comparator and the plurality of random access memory cells of the memory circuit.

19. The image sensor device of claim 18, wherein the second semiconductor die comprises:
 a row driver configured to generate a photo detector control signal and a memory control signal to control the photo detector and the memory circuit, respectively;
 a ramp generator configured to generate the ramp signal; and
 a counter configured to generate the code.

20. The image sensor device of claim 19, wherein
 the first connection structures formed between the first semiconductor die and the second semiconductor die is configured to provide the photo detector control signal and the ramp signal to the first portion of the digital pixel, and
 a metal layer formed in the second semiconductor die is configured to provide the memory control signal and the code to the second portion of the digital pixel.

* * * * *